(12) United States Patent
Otsuka

(10) Patent No.: US 12,255,043 B2
(45) Date of Patent: Mar. 18, 2025

(54) SCANNING ELECTRON MICROSCOPE AND IMAGE GENERATION METHOD USING SCANNING ELECTRON MICROSCOPE

(71) Applicant: JEOL Ltd., Tokyo (JP)

(72) Inventor: Takeshi Otsuka, Tokyo (JP)

(73) Assignee: JEOL Ltd., Tokyo (JP)

( * ) Notice: Subject to any disclaimer, the term of this patent is extended or adjusted under 35 U.S.C. 154(b) by 371 days.

(21) Appl. No.: 17/830,873

(22) Filed: Jun. 2, 2022

(65) Prior Publication Data

US 2022/0392737 A1 Dec. 8, 2022

(30) Foreign Application Priority Data

Jun. 3, 2021 (JP) ................. 2021-093595

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01); *H01J 2237/20214* (2013.01); *H01J 2237/24578* (2013.01); *H01J 2237/2814* (2013.01)

(58) Field of Classification Search
CPC ........ H01J 37/222; H01J 37/244; H01J 37/28; H01J 2237/20214; H01J 2237/24578; H01J 2237/2814; H01J 2237/24465
See application file for complete search history.

(56) References Cited

U.S. PATENT DOCUMENTS

| 11,959,735 B2* | 4/2024 | Nakai .................. H01J 37/265 |
| 2008/0283747 A1 | 11/2008 | Kawamata et al. |
| 2012/0112066 A1 | 5/2012 | Ogiso et al. |
| 2019/0362930 A1 | 11/2019 | Otsuka |
| 2020/0234914 A1* | 7/2020 | Li .......................... H01J 37/28 |

FOREIGN PATENT DOCUMENTS

| JP | S5196494 U | 8/1976 |
| JP | H08304419 A | 11/1996 |
| JP | 200386126 A | 3/2003 |
| JP | 2012112927 A | 6/2012 |
| JP | 2012238400 A | 12/2012 |
| JP | 2019204704 A | 11/2019 |

OTHER PUBLICATIONS

Extended European Search Report issued in EP22175872.5 on Feb. 3, 2023.
Partial European Search Report issued in EP22175872.5 on Nov. 3, 2022.
Office Action issued in JP2021093595 on Oct. 31, 2023.
Office Action issued in JP2021093595 on May 9, 2023.

* cited by examiner

*Primary Examiner* — David E Smith
*Assistant Examiner* — Christopher J Gassen
(74) *Attorney, Agent, or Firm* — The Webb Law Firm

(57) ABSTRACT

An electron beam is irradiated on a specimen in a state where a negative voltage is applied to the specimen. The specimen is rotated to establish an optimum orientation of a specimen surface shape relative to an orientation of a detector having two detection surfaces disposed at rotational symmetric positions with respect to an optical axis of the electron beam taken as an axis of rotation, and an image is generated based on a quantity of a signal from reflected electrons detected by the detector.

13 Claims, 19 Drawing Sheets

FIG. 29

| x→ | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 3 | 6 | 9 | 11 | 12 | 11 | 10 | 12 | 16 | 19 | 24 | 28 | 26 | 25 | 26 |
| 1 | 3 | 9 | 13 | 16 | 15 | 17 | 16 | 15 | 15 | 18 | 23 | 27 | 28 | 27 | 29 |
| 2 | 2 | 6 | 10 | 13 | 14 | 15 | 14 | 16 | 21 | 24 | 27 | 27 | 26 | 27 | 27 |
| 3 | 3 | 11 | 12 | 11 | 13 | 11 | 10 | 13 | 16 | 21 | 24 | 27 | 28 | 27 | 28 |
| 4 | 3 | 14 | 20 | 18 | 19 | 17 | 18 | 18 | 22 | 24 | 27 | 30 | 31 | 30 | 31 |
| 5 | 3 | 10 | 13 | 16 | 18 | 20 | 18 | 20 | 23 | 28 | 32 | 36 | 39 | 41 | 42 |

FIG. 30

| x→ | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 3 | 6 | 9 | 15 | 16 | 15 | 14 | 16 | 16 | 19 | 24 | 28 | 26 | 25 | 26 |

AVERAGE FOR LABEL 1
$Z_{m1y0}$ = 12.2
$Z_{m1y1}$ = 15.6
11.75
21
18
12.75

AVERAGE FOR LABEL 2
$Z_{m2y0}$ = 24.67
$Z_{m2y2}$ = 30.00
24.75
32.67
34.67
30.50

| y \ x | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 3 | 6 | 9 | 15 | 6 | 15 | 14 | 16 | 16 | 19 | 24 | 28 | 30 | 29 | 30 |
| 1 | 3 | 9 | 13 | 16 | 14 | 16 | 15 | 14 | 14 | 18 | 23 | 27 | 29 | 28 | 30 |
| 2 | 2 | 6 | 10 | 13 | 14 | 15 | 14 | 16 | 21 | 24 | 27 | 29 | 28 | 29 | 29 |
| 3 | 3 | 11 | 15 | 14 | 16 | 14 | 13 | 13 | 16 | 21 | 24 | 27 | 30 | 29 | 30 |
| 4 | 3 | 14 | 20 | 15 | 16 | 14 | 15 | 15 | 22 | 24 | 27 | 30 | 30 | 25 | 30 |
| 5 | 3 | 10 | 13 | 16 | 14 | 16 | 14 | 16 | 23 | 28 | 32 | 36 | 39 | 29 | 30 |

| y \ x | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 3 | 6 | 9 | 15 | 16 | 15 | 14 | 16 | 16 | 19 | 24 | 28 | 30 | 29 | 30 |
| 1 | 3 | 9 | 13 | 16 | 14 | 16 | 15 | 14 | 14 | 18 | 23 | 27 | 29 | 28 | 30 |
| 2 | 2 | 6 | 10 | 13 | 14 | 15 | 14 | 16 | 21 | 24 | 27 | 29 | 28 | 29 | 29 |
| 3 | 3 | 11 | 15 | 14 | 16 | 14 | 13 | 13 | 16 | 21 | 24 | 27 | 30 | 29 | 30 |
| 4 | 3 | 14 | 20 | 15 | 16 | 14 | 15 | 15 | 22 | 24 | 27 | 30 | 30 | 25 | 30 |
| 5 | 3 | 10 | 13 | 16 | 14 | 16 | 14 | 16 | 23 | 28 | 32 | 36 | 39 | 29 | 30 |

| y | a | b |
|---|---|---|
| 0 | -1.22 | 0 |
| 1 | 0.19 | 0 |
| 2 | -0.03 | 0 |
| 3 | -1.50 | 0 |
| 4 | 1.00 | 0 |
| 5 | 1.04 | 0 |

FIG. 33

| y | a | b |
|---|---|---|
| 0 | 0.02 | -3.80 |
| 1 | -0.56 | 5.44 |
| 2 | -0.50 | 3.50 |
| 3 | 0.32 | -5.36 |
| 4 | -0.31 | 5.18 |
| 5 | 1.33 | -5.33 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 3 | 6 | 9 | 15 | 6 | 15 | 14 | 16 | 16 | 19 | 24 | 28 | 30 | 29 | 30 |
| 1 | 3 | 9 | 13 | 16 | 14 | 16 | 15 | 14 | 14 | 18 | 23 | 27 | 29 | 28 | 30 |
| 2 | 2 | 6 | 10 | 13 | 14 | 15 | 14 | 16 | 21 | 24 | 27 | 29 | 28 | 29 | 29 |
| 3 | 3 | 11 | 15 | 14 | 16 | 14 | 13 | 13 | 16 | 21 | 24 | 27 | 30 | 29 | 30 |
| 4 | 3 | 14 | 20 | 15 | 16 | 14 | 15 | 15 | 22 | 24 | 27 | 30 | 30 | 25 | 30 |
| 5 | 3 | 10 | 13 | 16 | 14 | 16 | 14 | 16 | 23 | 28 | 32 | 36 | 39 | 29 | 30 |

SCANNING ELECTRON MICROSCOPE AND IMAGE GENERATION METHOD USING SCANNING ELECTRON MICROSCOPE

CROSS REFERENCE TO RELATED APPLICATION

This application claims priority to Japanese Patent Application No. 2021-093595 filed on Jun. 3, 2021, the disclosure of which is hereby incorporated by reference in its entirety.

BACKGROUND

Field

The present disclosure relates to a scanning electron microscope and to an image generation method using the scanning electron microscope.

Description of Related Art

In a Scanning Electron Microscope (SEM), an electron beam is emitted onto a specimen. Electrons incident onto the specimen are scattered through interaction with atoms constituting the specimen and diffused while exciting secondary electrons. Then, a part of the electrons arriving at the surface of the specimen are released to the outside of the specimen. In the process of being scattered and released, because the electrons are affected by composition and the shape of the specimen, a quantity of released electrons may be changed depending on the composition and shape of the specimen. For this reason, the shape of a specimen surface and composition of the specimen can be observed in an image that is generated, based on scanned positions of the electron beam and a quantity of a signal from the electrons, by detecting the released electrons while scanning the electron beam on the specimen.

Electrons are also released from a position distant from an incident position depending on a manner of scattering. Therefore, information obtained from detected electrons can include, in addition to information on the composition and the shape of the specimen at the incident position of the electron beam, information on the composition and the shape of the specimen at a position where an electron is released. For this reason, resolution cannot be smaller than a scattered area even though the electron beam is intensively focused onto a point. A typical scanning electron microscope in which a scattered area of incident electrons has a size greater than an atomic size cannot provide an atomic resolution image.

In general, an SN value of an SEM image is improved by collecting and detecting as many signals as possible. To achieve this, a detection method may be employed, in which a detector is arranged at a site where a large number of signals can be obtained, and an electromagnetic field around the detector is controlled to collect and detect electrons in the detector.

In this connection, JP 2012-238400 A discloses generation of an image representing a three-dimensional shape based on reflected electrons, and JP S51-96494 A discloses detection of an uneven shape of a specimen surface.

Meanwhile, electrons scattered on a specimen are released from the specimen with a wide range of energy/angle. Signal strength, which reflects features of the specimen depending on energy and angles of released electrons, is obtained. For this reason, an image in which specific characteristics of the specimen are emphasized can be obtained by selectively detecting electrons having specific energy and angles of electrons. However, when a higher priority is given to improvement in SN values when the detector is designed, information obtained from the detector will contain, in a mixed manner, various kinds of information. As a result, it may be difficult for a user to identify necessary information.

Such information may include, for example, information about the shape of a surface of a specimen. For example, the surface of a semiconductor wafer is basically composed of only flat regions and riser regions. This structure is composed of a combination of steps and terraces (hereinafter referred to as a step and terrace structure). The steps are formed by the riser regions, and the terraces are formed by flat regions. It may be, in some cases, difficult to obtain information about the structure. In general, quality of a semiconductor wafer is considered superior as a defect density in a crystal is decreased. When a defect is present in crystal, the step and terrace structure of the semiconductor wafer is deformed due to an influence from the defect. For this reason, the quality of the semiconductor wafer can be evaluated based on the step and terrace structure of the surface of the semiconductor wafer.

However, it is almost impossible to detect a thickness and a shape of a portion of the specimen corresponding to several atomic layers, from an SEM image in which various kinds of information about the specimen are mixedly contained. Accordingly, the step and terrace structure cannot be evaluated.

An object of the present disclosure is directed to detecting electrons containing information about a top surface of a specimen to acquire information about the shape of a portion of the specimen corresponding to several atomic layers.

SUMMARY OF THE DISCLOSURE

In an aspect of this disclosure, a scanning electron microscope is provided, the scanning electron microscope including an electron beam irradiation apparatus configured to irradiate a specimen with an electron beam while scanning the electron beam on the specimen, a detector having two detection surfaces disposed at rotational symmetric positions with respect to an optical axis taken as an axis of rotation, the electron beam propagating along the optical axis, the detector being configured to detect a reflected electron which is released from the specimen irradiated with the electron beam, a controller configured to rotate the specimen, and a signal processor configured to generate an image based on a quantity of a signal from the reflected electron detected by the detector when the electron beam is irradiated on the specimen while the specimen is rotated.

In an aspect of this disclosure, a scanning electron microscope is provided, the scanning electron microscope including an electron beam radiation apparatus configured to irradiate a specimen with an electron beam while scanning the electron beam on the specimen, a detector having three or more detection surfaces disposed at rotational symmetric positions with respect to an optical axis taken as an axis of rotation, the electron beam propagating along the optical axis, the detector being configured to detect a reflected electron which is released from the specimen irradiated with the electron beam, and a signal processor configured to generate an image based on quantities of signals from reflected electrons detected by at least two of the three or more detection surfaces.

The signal processor may be configured to generate an image based on a difference between the quantities of signals from the reflected electrons which are detected on at least two detection surfaces contained in the detector.

The signal processor may be configured to calculate, based on a difference between the quantities of the signals, a height of a surface of the specimen.

The signal processor may be configured to calculate heights of the surface of the specimen at scanned positions where the electron beam is irradiated, extract flat regions on the surface of the specimen based on differences between the quantities of the signals at the scanned positions, apply labels to the extracted flat regions to discriminate the flat regions from each other, and correct the heights at scanned positions located in a same one of the flat regions to equalize the heights at the scanned positions located in the same one of the flat regions while maintaining an average of the heights at the scanned positions located in the same one of the flat regions.

The signal processor may be configured to correct a height of the surface in a region between two of the flat regions using the corrected heights of the surface in the flat regions.

The signal processor may be further configured to colorize the image with colors which vary depending on the heights.

The signal processor may be further configured to extract, from the image, a crystal defect based on a shape of a step riser formed on the surface of the specimen, and operate a display to display an extracted result.

Information about a position of the defect may be used in an external analyzing apparatus and an external processing apparatus.

Release angles of reflected electrons may be determined relative to the specimen, and a range of the release angles of reflected electrons detectable in the detector may be determined based on energy of the electron beam, a bias voltage applied to the specimen, and a distance between the specimen and the detector.

The controller may be configured to operate the display to display information about the range of release angles.

Two parameters may be selected by a user from a group of parameters consisting of the energy of the electron beam, the bias voltage applied to the specimen, and the distance between the specimen and the detector, and a remaining parameter needed to detect the reflected electrons released at an angle within the range of release angles may be calculated based on the two parameters.

In an aspect of this disclosure, an image generation method using a scanning electron microscope is provided, the method including irradiating a specimen with an electron beam while rotating the specimen, detecting, in a detector, a reflected electron released from the specimen irradiated with the electron beam, the detector having two detection surfaces disposed at rotational symmetric positions with respect to an optical axis of the electron beam taken as an axis of rotation, and generating an image based on a quantity of a signal from the reflected electron detected in the detector.

According to the present disclosure, information about a shape of a portion of a top surface of a specimen, the portion corresponding to several atomic layers, can be acquired by detecting electrons which contain information of the top surface of the specimen.

BRIEF DESCRIPTION OF THE DRAWINGS

Embodiments of the present disclosure will be described based on the following figures, wherein:

FIG. 29 is a diagram showing an example of a map of heights;

FIG. 30 is a diagram showing an example of corrected heights for a row of y=0;

FIG. 31 is a diagram showing an example of a map of corrected heights;

FIG. 32 is a diagram showing an example of the map of corrected heights;

FIG. 33 is a diagram showing coefficients used for correcting the heights;

FIG. 34 is a diagram showing coefficients used for correcting the heights;

FIG. 35 is a diagram showing an example of the map of corrected heights;

DESCRIPTION OF THE DISCLOSURE

First Embodiment

Figure 1:
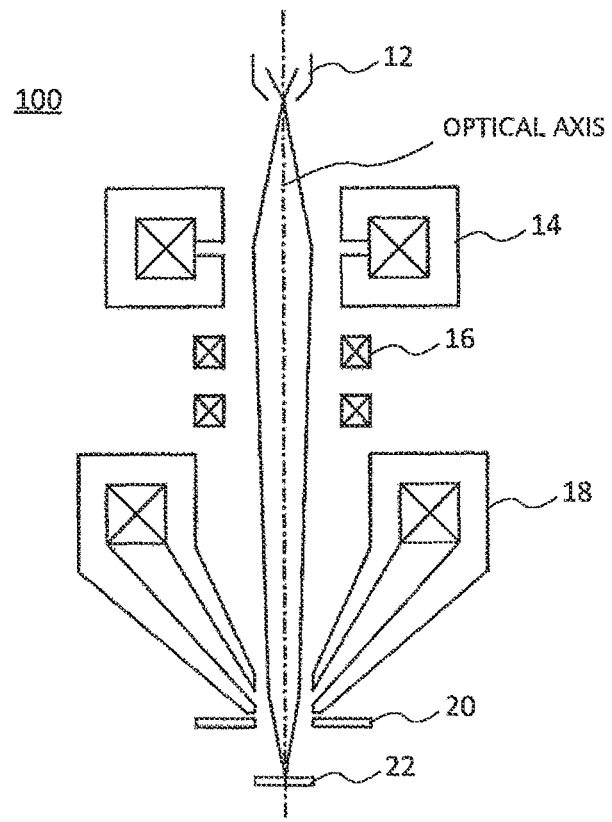
FIG. 1 is a diagram showing a structure of a typical scanning electron microscope.

Prior to explaining a scanning electron microscope according to a first embodiment, a typical scanning electron microscope is explained with reference to FIG. 1. FIG. 1 shows a typical scanning electron microscope 100. The scanning electron microscope 100 is an apparatus for irradiating a specimen with an electron beam and detecting reflected electrons released from the specimen to generate an image.

The scanning electron microscope 100 includes an electron gun 12 which generates electron beams, a group of lenses including a focusing lens 14, a deflection lens 16, and an objective lens 18, a group of coils including a deflection coil and a scanning coil, and a detector 20 which detects the reflected electrons released from a specimen 22. The electron gun 12, the focusing lens 14, the deflection lens 16, the objective lens 18, the detector 20, and the specimen 22 are arranged in that order. The electron gun 12, the group of lenses, the group of coils, and the detector 20 may be implemented using well-known components.

The specimen 22 is placed within a specimen chamber. The specimen chamber has a stage on which the specimen 22 is placed. The stage may be movable in three dimensions (within a plane and in a height direction) along an x axis, a y axis, and a z axis, or may be movable in two-dimensions (within the plane).

The scanning electron microscope 100 further includes components which are not illustrated in FIG. 1, such as a replacement chamber for replacing specimens 22 to be placed within the specimen chamber, and a vacuum pumping system for reducing pressure in the inside of the specimen chamber, for example.

The electron beam generated by the electron gun 12 is irradiated onto the specimen 22. The electron beam is focused through the group of lenses including the focusing lens 14, the deflection lens 16, and the objective lens 18 onto the surface of the specimen 22, and is scanned on the specimen 22 by the scanning coil. Reflected electrons and secondary electrons are released from the specimen 22 irradiated with the electron beam.

The detector 20 is disposed above the specimen 22 (i.e., on an electron gun 12 side), to detect the reflected electrons released from the specimen 22. For example, the detector 20 may be a semiconductor detector. The reflected electrons released from the specimen 22 are incident upon the detector 20 and detected therein. Upon detection of the reflected electrons, the detector 20 generates an electric signal which is amplified for generation of an image of the reflected electrons. For example, the electric signal is input into an image processor, and the image processor generates the image based on the electric signal. The image is displayed, for example, on a display.

Figure 2:
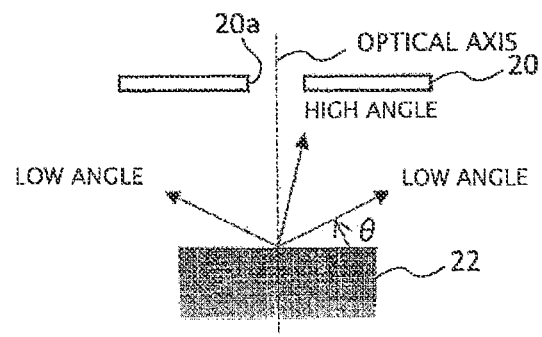
FIG. 2 is a cross sectional view of a detector and a specimen.

With reference to FIG. 2, a release angle of the reflected electron is explained. FIG. 2 is a cross sectional view of the detector 20 and the specimen 22. The detector 20 has an annular shape, for example. Specifically, a circular through hole 20a is defined in the center of the detector 20.

A release angle θ is defined with reference to the surface of the specimen 22. Angles close to an angle of a line parallel to the surface of the specimen 22 are referred to as low angles, whereas angles close to an angle of an optical axis along which the electron beams propagate are referred to as high angles.

Electrons scattered in an extremely shallow area close to the surface of the specimen 22 must be detected in order to detect a shape of a step corresponding to several atomic layers. A group of electrons released at the low angle relative to the surface of the specimen 22, for example, contains a high percentage of electrons scattered at positions close to the surface of the specimen 22 (i.e., at shallow positions).

Figure 3:
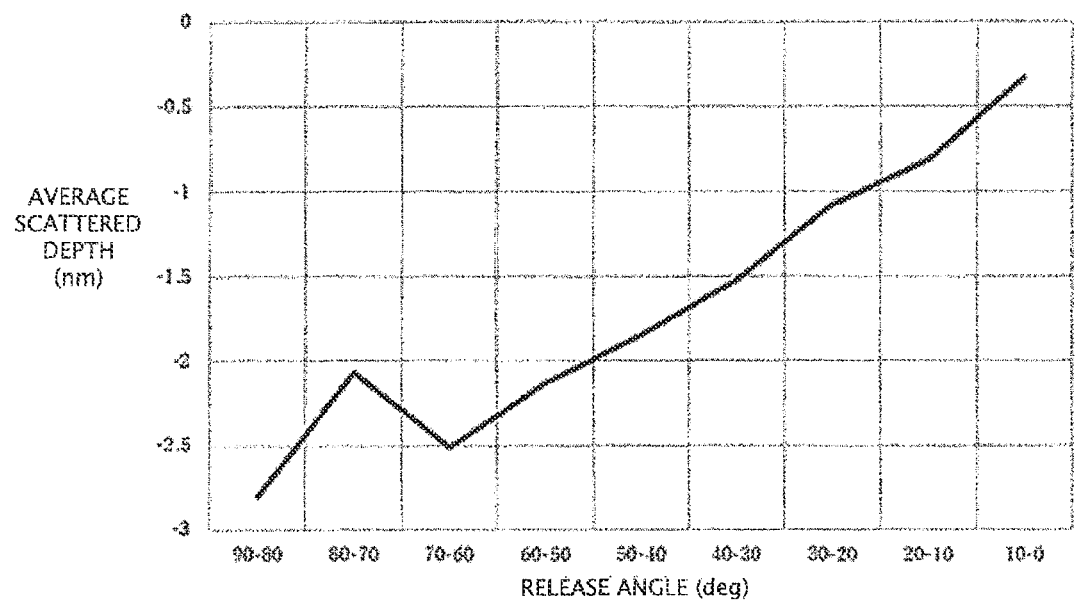
FIG. 3 is a diagram showing a relationship between a release angle and a scattered depth.

FIG. 3 shows a relationship between release angles of the reflected electrons and scattered depths of the electrons. In FIG. 3, the horizontal axis represents the release angles of the reflected electrons, while the vertical axis represents average values of the scattered depths of the electrons. The specimen 22 is composed of gallium nitride (GaN), and an acceleration voltage of primary electrons is 3 kV. A value plotted on the vertical axis is an average of scattered depths corresponding to each release angle. The average value is calculated using Monte Carlo simulation CASINO (v2.4.8.1).

As shown in FIG. 3, as release angles of the reflected electrons approach the lower angles, the scattered depths become shallower. Therefore, when the image is generated using the reflected electrons released at lower angles, a slight change in the shape of the surface of the specimen 22 can be identified in the image. In general, however, the number of reflected electrons released at higher angles is great, while the number of reflected electrons released at the lower angles is small. For this reason, when the specimen 22 is observed under ordinary measurement conditions, information about the reflected electrons released at the lower angles is buried in information about those released at the higher angles. Consequently, it becomes problematically difficult to observe the slight change in the shape of the surface of the specimen 22.

To overcome the problematic difficulty, a method for shortening a distance between the detector 20 and the specimen 22 may be employed. Assuming that the reflected electrons released from the specimen 22 travel in straight lines, angles of detectable reflected electrons are shifted toward lower angles by shortening the distance between the detector 20 and the specimen 22. For example, the distance between the detector 20 and the specimen 22 is reduced by moving the specimen 22 toward the detector 20, or may be reduced by moving the detector 20 toward the specimen 22.

Alternatively, deceleration optics may be employed. In the scanning electron microscope, a relatively high voltage of minus several kilovolts (a specimen bias voltage) may be applied to the specimen 22 in some cases, to create an electric field between the specimen 22 and the objective lens 18. The electric field acts as a deceleration field on primary electrons. In this way, a chromatic aberration is improved and energy of incident electrons is reduced, which can cause the electrons to be scattered within a limited range, leading to an improved resolution of the SEM image.

On the other hand, the electric field generated by means of the deceleration optics acts, as an acceleration field, on the reflected electrons released from the specimen 22. For this reason, the reflected electrons released from the specimen 22 are accelerated toward the objective lens 18, which causes travel directions of the reflected electrons to deflect toward a high angle side. As a result, low-angle reflected electrons, which would pass through a space between the specimen 22 and the detector 20 under usual conditions, are directed into the detector 20. The acceleration field also functions to increase kinetic energy of the reflected electrons.

Figure 4A:
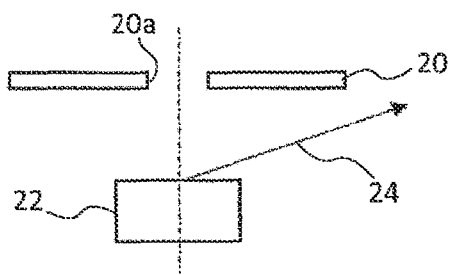
FIG. 4A is a cross sectional view of the detector and the specimen.
Figure 4B:
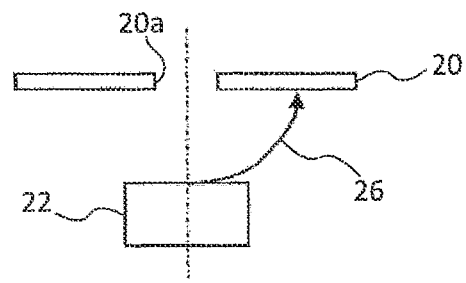
FIG. 4B is a cross sectional view of the detector and the specimen.

With reference to FIGS. 4A and 4B, a trajectory of the reflected electron that is changed in response to application of the specimen bias voltage is explained. FIGS. 4A and 4B are cross sectional views showing the detector 20 and the specimen 22. When no specimen bias voltage is applied to the specimen 22, a reflected electron 24 released at a low angle from the specimen 22 travels, as shown in FIG. 4A, through the space between the detector 20 and the specimen 22, and is therefore not detected by the detector 20. On the other hand, when the specimen bias voltage is applied to the specimen 22, a reflected electron 26 released from the specimen 22 is deflected toward the high angle side as shown in FIG. 4B, which causes the reflected electron 26 to enter the detector 20.

In a semiconductor detector which is commonly used as the detector 20, electrons incident onto the semiconductor detector generate carriers, and an electric signal can be extracted when the carriers travel toward a P type semiconductor and an N type semiconductor. As kinetic energy of the electron incident upon the semiconductor detector becomes higher, a greater number of carriers are generated, and magnitude of the electric signal is accordingly increased. Consequently, electrons can be detected with efficiency, and an SN value is accordingly improved. In this regard, the deceleration optics can be considered an efficient technique for acquiring the reflected electrons whose release angles are low.

However, application of the specimen bias voltage may not always lead to efficient acquisition of reflected electrons having low angles.

For example, electrons can be greatly decelerated prior to reaching the specimen 22 by reducing a difference between an electron beam acceleration voltage and the specimen bias voltage, in order to decrease energy of electrons incident onto the specimen 22 to 1 keV or lower. However, decreased energy of incident electrons results in decreased energy of the reflected electrons. When the specimen bias voltage is excessively high relative to release energy of the reflected electrons, the trajectory of the reflected electron is greatly deflected toward the high angle side. In general, the detector 20 has the through hole 20a for allowing the primary electron to pass therethrough. The reflected electrons which are greatly deflected to the high angle side will pass through the through hole 20a without being received by the detector 20.

Figure 5:
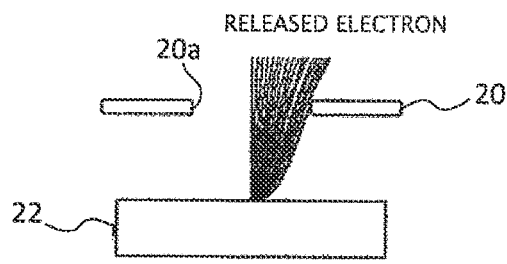
FIG. 5 is a cross sectional view of the detector and the specimen.

A simulated result of trajectories of the reflected electrons is shown in FIG. 5. FIG. 5 is a cross sectional view showing the detector 20 and the specimen 22. Conditions for simulation are indicated below.

Diameter of the through hole 20a: 4 mm
Specimen bias voltage: −2 kV
Distance between the detector 20 and the specimen 22: 3 mm
Electron beam acceleration voltage: 2.1 kV
Under the above conditions, because energy of the electrons at the time of entering the specimen 22 is 100 eV, maximum energy of the reflected electrons released from the specimen 22 is 100 eV.

Assuming that reflected electrons having energy of 100 eV are released at angles in a range between 0 degrees and 90 degrees from the surface of the specimen 22, trajectories of the reflected electrons within an electric field are simulated.

The simulation result reveals, as illustrated in FIG. 5, that most of the reflected electrons pass through the through hole 20a, without being caught by the detector 20.

As such, application of the specimen bias voltage to the specimen 22 does not always enable detection of the reflected electrons having the low angles. Optimum observation conditions exist for effectively detecting the reflected electrons released at the low angles, the optimum observation conditions including conditions for the specimen bias voltage, the shape of the detector 20, the distance between the detector 20 and the specimen 22, and the primary electron acceleration voltage.

<Optimum Observation Conditions>

Hereinafter, the optimum observation conditions for effectively detecting the reflected electrons released at the low angles will be described.

For example, when no specimen bias voltage is applied to the specimen 22, and no strong magnetic field is created around the detector 20, the reflected electrons travel in a straight line while maintaining their released angles. A range of angles of the reflected electrons detectable by the detector 20 can be calculated based on the shape of the detector 20 and the distance between the detector 20 and the specimen 22.

However, when the specimen bias voltage is applied to the specimen 22, an electric field is created between the detector 20 and the specimen 22, which causes the reflected electrons to deflect through the electric field. Because of this, it becomes impossible to know at which angle the detected reflected electron was released. As a result, it cannot be easily determined which observation condition is suitable for effectively detecting the reflected electrons released at the low angles.

Figure 6:
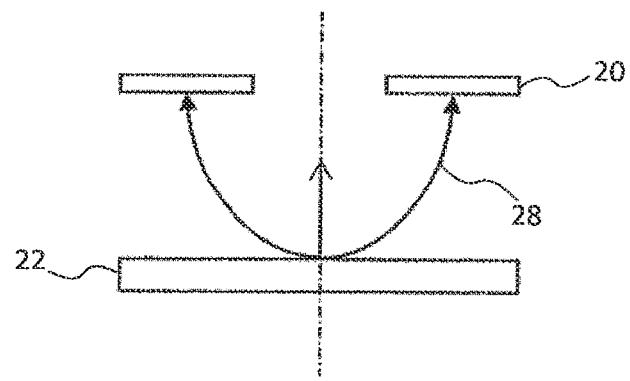
FIG. 6 is a cross sectional view of the detector and the specimen.
Figure 7:
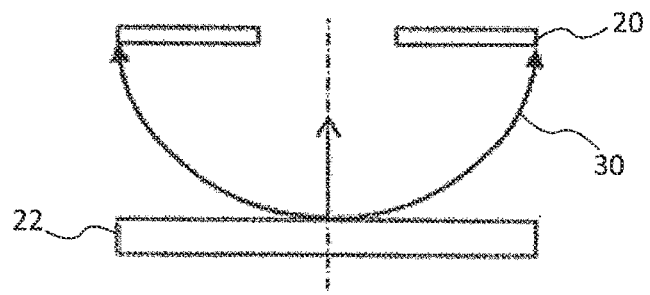
FIG. 7 is a cross sectional view of the detector and the specimen.

This issue is explained below with reference to FIGS. 6 and 7. FIGS. 6 and 7 are cross sectional views showing the detector 20 and the specimen 22.

It is assumed that reflected electrons are deflected due to the presence of the electric field, and a reflected electron 28 released at the release angle of 0 degrees is incident upon the detector 20 at a position close to the center of a detection surface (a surface facing the specimen 22) of the detector 20 as shown in FIG. 6. Because there are no reflected electrons released at an angle smaller than 0 degrees, a portion of the detection surface of the detector 20 that is located outward of the position close to the center (i.e., the position at which the reflected electron 28 released at 0 degrees is incident) receives no reflected electrons, and is not utilized for acquisition of a signal.

On the other hand, when the observation condition is established so as to cause a reflected electron 30 released at 0 degrees to be incident upon the outermost position on the circumference of the detection surface of the detector 20 as shown in FIG. 7, the entire area of the detection surface of the detector 20 can be utilized for detecting the reflected electrons. This yields a favorable result that the reflected electrons released at the lower angles can be detected with efficiency. To achieve this, specific conditions must be defined for the specimen bias voltage, the shape of the detector 20, the distance between the detector 20 and the specimen 22, and the primary electron acceleration voltage, respectively. The conditions are computed, for example, through a simulation.

Because a trajectory of a charged particle in an electromagnetic field can be computed by means of a simulation, optimum observation conditions for effectively detecting the reflected electrons of the low angles can be computed by performing simulations while changing observation conditions. However, performing a simulation under each of the observation conditions is time-consuming work. To perform the simulation, shapes of components in the scanning electron microscope must be known. However, it is extremely difficult for a user to know all of the shapes of the components for computing the observation conditions.

With this in view, an equation to easily find the optimum observation conditions is found in this embodiment. Specifically, on the assumption that the detection surface of the detector 20 and the surface of the specimen 22 are parallel plate electrodes, a quantity of deflection of an electron is found based on an amount of force that is exerted on the electron existing between the parallel plate electrodes when a voltage is applied between the parallel plate electrodes; i.e., the detection surface of the detector 20 and the surface of the specimen 22. In an actual scanning electron microscope, because the detection surface of the detector 20 and the surface of the specimen 22 are not infinitely parallel or flat, a resultant value obtained from the equation contains an error. Nevertheless, the resultant values may be exploited as material for determining whether or not a found observation condition is the optimum observation condition (i.e., the condition for enabling effective acquisition of the reflected electrons released at the low angles).

Figure 8:
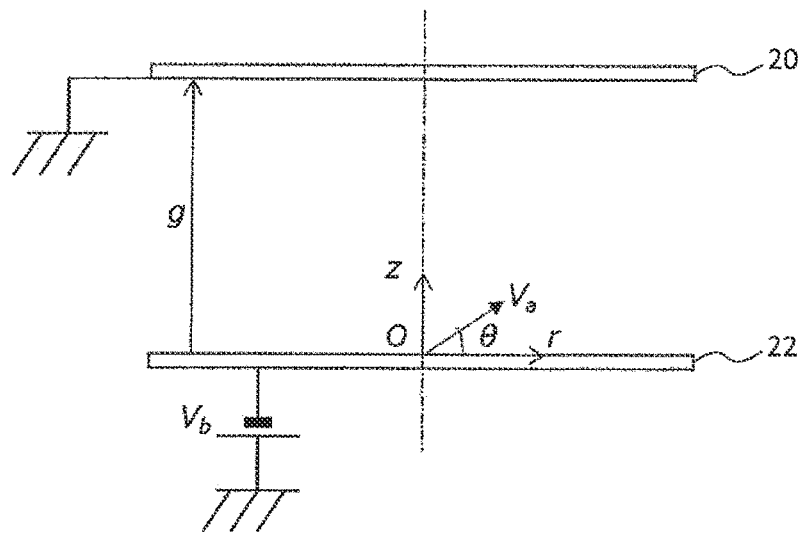
FIG. 8 is a diagram showing a parallel plate electrode.

FIG. 8 shows parallel plate electrodes corresponding to the detector 20 and the specimen 22. It should be noted that in FIG. 8, one of the parallel plate electrodes corresponding to the detector 20 is identified with reference numeral (20), the same as that of the detector 20, and the other one of the parallel plate electrodes corresponding to the specimen 22 is identified with reference numeral (22), the same as that of the specimen 22.

Voltage applied to the specimen 22 is defined as $V_b$, and a distance between the detector 20 and the specimen 22 is defined as g. Further, an (r, z) coordinate system is defined. The origin (r=0, z=0) of the coordinate system is set to the center of the specimen 22. Coordinate component r is a radius component, and coordinate component z is a height component. The detector 20 is placed at a position of z=g with reference to the position of the specimen 22.

Maximum kinetic energy of the reflected electron released from the specimen 22 is defined as $V_a$, and the release angle of the reflected electron is defined as 0. The angle θ is defined relative to the specimen 22.

Coordinates (r, θ) of the trajectory of the reflected electron released from the specimen 22 are expressed as indicated in the following equation (1).

[Equation 1]

$$z = \frac{1}{g(1+\cos\theta)} \frac{-V_b}{2V_a} r^2 + r\tan\theta \quad (1)$$

The energy $V_a$ possessed by the reflected electron at the time of release from the specimen 22 usually has a value equal to that of energy (also referred to as landing energy) possessed by the primary electron immediately before entering the specimen 22.

Figure 9:
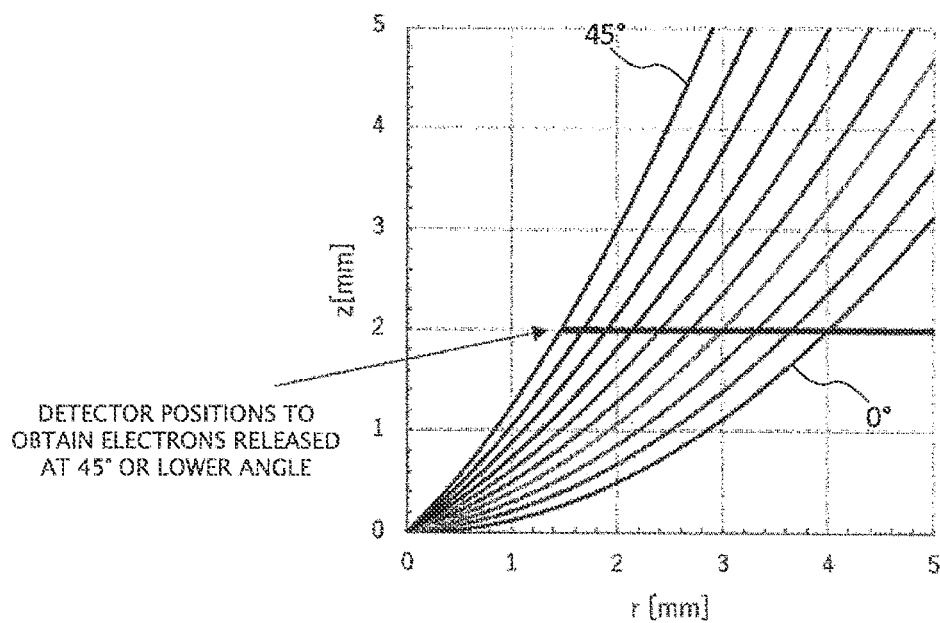
FIG. 9 is a diagram showing trajectories of reflected electrons.

FIG. 9 shows the trajectories determined using the above equation (1). In FIG. 9, the horizontal axis represents the radius component r (mm), and the vertical axis represents the height component z (mm). In FIG. 9, the trajectories are plotted every 5 degrees in a range of release angles between 0° and 45°. For example, when the height z=2 mm, reflected electrons released at a release angle of 45° or lower can be detected with the detector 20 having an outer radius r of approximately 4 mm (having the through hole 20a whose radius is approximately 1.5 mm). In other words, when the detector 20 having the outer radius r of approximately 4 mm is used, the reflected electrons having the release angle of 45° or lower can be detected by placing the detector 20 substantially at a position where z=2 mm. It should be noted that the energy of the reflected electron is 2 keV, and the specimen bias voltage is −2 kV.

The coordinate z obtained by equation (1) for a location where the electron finally impinges on the detector 20 is equal to g. Then, g is substituted for z in equation (1), and equation (1) is converted, under conditions that 0≤g, 0≤$V_a$, $V_b$≤0, 0≤θ≤90, into the following equation (2) for obtaining a value of the coordinate component r.

[Equation 2]

$$r = \frac{gV_a(1+\cos 2\theta)\left(-\tan\theta + \sqrt{\tan^2\theta + \frac{2}{(1+\cos 2\theta)}\frac{-V_b}{V_a}}\right)}{-V_b} \quad (2)$$

Equation (2) yields the coordinate component r of the position at which the electron having the kinetic energy $V_a$ and the release angle θ impinges on the detection surface of the detector 20 when the voltage $V_b$ is applied to the specimen 22, and the detector 20 is placed at the distance g from the specimen 22. When the calculated coordinate component r is found to be within the range of the detection surface, it can be determined that the reflected electron released at the release angle θ corresponding to the calculated coordinate component r can be detected by the detector 20.

<Effective Detection of Low-Angle Reflected Electron>

Using equation (2), the observation condition for enabling effective detection of the low angle reflected electron is determined.

As shown in FIG. 7, the observation condition under which the reflected election having the release angle of θ=0 impinges on the outer circumferential edge of the detection surface of the detector 20 is the optimum observation condition for enabling effective detection of reflected electrons released at the low angles. Substituting θ=0 in equation (2), the following equation (3) is obtained.

[Equation 3]

$$r = -\frac{2gV_a\sqrt{\frac{-V_b}{V_a}}}{V_b} \quad (3)$$

When two out of the parameters of incident energy $V_a$ of the primary electron, the specimen bias voltage $V_b$, and the distance g between the detector 20 and the specimen 22 are specified, the remaining one of the parameters can be calculated. The below described equations (4), (5), and (6) are equations for calculating the parameters, in which equation (4) is an equation for calculating the incident energy $V_a$, equation (5) is an equation for calculating the specimen bias voltage $V_b$, and equation (6) is an equation for calculating the distance g.

[Equation 4]

$$V_a = -\frac{r^2 V_b}{4g^2} \quad (4)$$

[Equation 5]

$$V_b = -\frac{4g^2 V_a}{r^2} \quad (5)$$

[Equation 6]

$$g = \frac{r\sqrt{-\frac{V_b}{V_a}}}{2} \quad (6)$$

For example, in a case of detecting reflected electrons of low angles with the detector 20 having the detection surface whose diameter is 10 mm, when it is desired to perform observations under conditions that r=0.005 m, $V_a$=2000, and $V_b$=−2000, the distance g of approximately 2.5 mm can be found as one of the optimum conditions by substituting the above values of r, $V_a$, and $V_b$ into equation (6). In this way, the observation conditions for enabling effective detection of the reflected electrons released at the low angles can be calculated.

For example, the user may set the calculated parameters in the scanning electron microscope. Alternatively, the user may select two parameters out of the parameters $V_a$, $V_b$, and g, and the remaining parameter may be automatically calculated using the corresponding one of equations (4) to (6) and the two parameters set by the user, and automatically set in the scanning electron microscope. For example, a controller 51, which will be described below, may calculate the remaining parameter.

It is assumed, for example, that the user specifies 2000 as $V_a$ and 3 mm as a working distance of the objective lens 18.

When the detection surface of the detector 20 is placed at a distance 0.5 mm from the objective lens 18, g=2.5 mm. Then, these values are substituted into equation (5) to calculate the specimen bias voltage $V_b$, and the calculated specimen bias voltage $V_b$ is automatically set. As a result, the observation conditions for enabling effective detection of the reflected electrons released at the low angles are automatically established in the scanning electron microscope.

The above-described method is not limited to application to detection of the reflected electrons of low angles, and there is no limitation to the range of release angles applicable to the above-described method. Further, there is no limitation to detection of electrons applicable to the method, such as a limitation that electrons to be detected must be released at a particular release angle or lower.

<Adjustment on High Angle Side>

Figure 10:
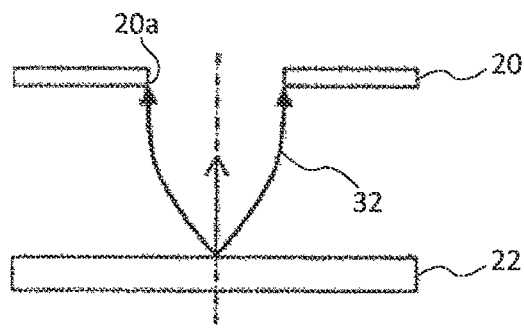
FIG. 10 is a cross sectional view of the detector and the specimen.

Depending on specimens, an object to be detected may not necessarily be limited to the reflected electrons released at low angles, and it may be beneficial in terms of observation of the SEM image that reflected electrons whose release angles are high and whose signal quantities are great are included in the object to be detected. In such a case, for example, an observation condition for enabling detection of reflected electrons released at a release angle of 45° or lower may be specified. Using the above-described equation (2), the parameter r is calculated to find an incident position of a reflected electron released at the release angle θ, the incident position being on a rim of the through hole 20a in the detector 20 (i.e., an inner circumference edge of the detection surface). Then, the through hole 20a having the radius r is defined in the detector 20, which enables the detector 20 to detect reflected electrons released at the release angle θ or lower. FIG. 10 shows a reflected electron 32 that is released at the release angle θ and incident on the inner circumference edge of the detection surface.

For example, substituting θ=45° into the equation (2) yields equation (7) shown below.

[Equation 7]

$$r = -\frac{gV_a\left(-1 + \sqrt{1 + 2\frac{-V_b}{V_a}}\right)}{V_b} \quad (7)$$

When an inner radius r of the detection surface (i.e., the radius of the through hole 20a) is defined as r=0.0015 m, the incident energy $V_a$ of the primary electron is defined as $V_a$=2000, and the specimen bias voltage $V_b$ is defined as $V_b$=2000, equation (7) is expressed with the distance g between the detector 20 and the specimen 22 as shown in the following equation (8).

[Equation 8]

$$0.0015 = -\frac{2000g(-1 + \sqrt{1+2})}{-2000} \quad (8)$$

From equation (8), g=0.002049 m is obtained.

Then, the distance g between the detector 20 and the specimen 22 is set to approximately 2 mm. In this way, the detector 20 is configured to be able to detect the reflected electrons released at 45° or lower.

For example, when the user specifies two parameters from among the parameters of the acceleration voltage $V_a$, the specimen bias voltage $V_b$, and the distance g between the detector 20 and the specimen 22, and further specifies an angle range of the reflected electrons which the user desires to detect (for example, with upper and lower limits of the range), other parameters required for detecting the reflected electrons under the specified conditions may be automatically established.

Figure 11:
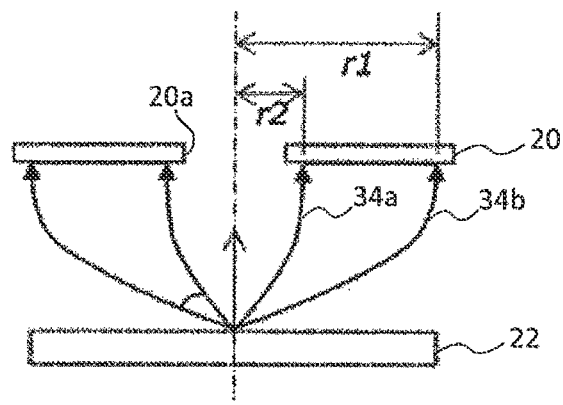
FIG. 11 is a cross sectional view of the detector and the specimen.

This process is described in detail with reference to FIG. 11. FIG. 11 is a cross section view showing the detector 20 and the specimen 22. Reference sign r1 represents a radius of the outer circumference of the detector 20 (the outer radius), and reference sign r2 represents a radius of the inner circumference of the detector 20 (i.e., the radius of the through hole 20a). Reference signs 34a and 34b represent reflected electrons released from the specimen 22. The reflected electron 34a is incident upon a position close to the inner circumference of the detector 20, and the reflected electron 34b is incident upon a position close to the outer circumference of the detector 20.

In a case where the user specifies the release angle to an angle θ or lower, substituting r=r1 and values of observation conditions specified by the user into equation (2), the remaining parameter which is not specified by the user is calculated. For example, when the user specifies the specimen bias voltage $V_b$ and the distance g between the detector 20 and the specimen 22, the acceleration voltage $V_a$ is obtained from equation (2). Then, using the specified and obtained parameters, the detector 20 can be configured to detect reflected electrons released at angles in the range desired by the user.

<Display of Detectable Angle Range>

An angle range of the reflected electrons detectable by the detector 20 may be calculated based the observation conditions, and presented on a display. This allows the user to recognize the angle range of reflected electrons being detected. As a result, the user can determine with reference to the displayed angle range whether or not reflected electrons are detected under the optimum observation conditions.

From the observation conditions, the incident energy $V_a$ of the primary electron and the specimen bias voltage $V_b$ are determined. The distance between the detector 20 and the specimen 22 is determined from an attached position of the detector 20 and the working distance (WD) of the objective lens 18. The above-described equation (2) can be used for finding an angle θ1 in a state where the parameter r matches the outer radius r1 of the detector 20 substituted and an angle θ2 in a state where the parameter r matches the inner radius r2 of the detector 20. For example, a value of 0 is substituted into equation (2) while changing the value in 0.1° increments in a range from 0° to 90°, to calculate r. Then, when a value closest to the outer radius r1 is obtained for r by equation (2), the value of 0 substituted herein can be used as an approximate value of θ1. Similarly, when a value closest to the inner radius r2 is obtained for r by the equation (2), the value of θ2 substituted herein can be used as an approximate value of θ2. After the values of θ1 and θ2 are obtained, information indicating, for example, a "Detectable Angle Range from θ1° to θ2°" is presented on the display. The below-described controller 51 operates the display to show the information indicating the detectable angle range.

<Divided Detector>

Figure 12:
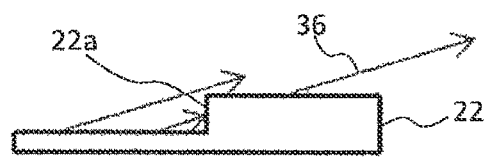
FIG. 12 is a cross sectional view showing a part of the specimen.
Figure 13:
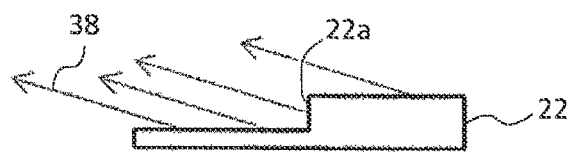
FIG. 13 is a cross sectional view showing a part of the specimen.

The reflected electrons of low angles are apt to provide information reflecting the surface shape of the specimen 22, although, depending on observation conditions, there may be a situation that the information is not obtained. The reason for occurrence of the situation is explained with reference to FIGS. 12 to 14. FIGS. 12 and 13 are cross sectional views showing a part of the specimen 22, and FIG. 14 is a perspective view showing the detector 20 and the part of the specimen 22.

Figure 14:
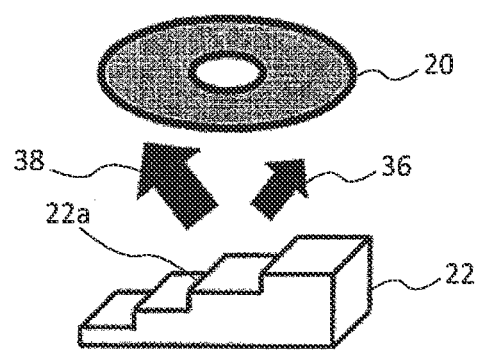
FIG. 14 is a perspective view showing a part of the specimen and a detector in the related art.

As shown in FIGS. 12 to 14, the specimen 22 has a step riser 22a on the surface (for example, a region forming a wall on the surface). For example, the surface of the specimen 22 has a stepwise shape whose height is gradually increased in one direction, and step risers 22a are accordingly formed on the surface of the specimen 22.

When the step riser 22a is formed on the surface of the specimen 22, a quantity of reflected electrons detected by the detector 20 varies depending on released directions of the low-angle reflected electrons.

As shown in FIG. 12, for example, reflected electrons 36 which are released in a rising direction of the stepwise region may be blocked by the step riser 22a. Such a blocked reflected electron 36 is not detected by the detector 20, which causes a decrease in the quantity of the signal in the vicinity of the step riser 22a.

On the other hand, as shown in FIG. 13, reflected electrons 38 which are released in a descending direction of the stepwise region are not blocked by the step riser 22a and accordingly are detected by the detector 20. Further, electrons released from the step riser 22a are joined to the reflected electrons 38. Therefore, as compared with the situation illustrated in FIG. 12, the quantity of signal is increased.

As described above, the signal reflecting the surface shape of the specimen 22 has directional properties. For this reason, when reflected electrons are detected by means of the detector 20 having the annular shape shown in FIG. 14, information about an uneven shape of the surface of the specimen 22 is cancelled, and an image representing the uneven shape cannot be obtained.

Figure 15:
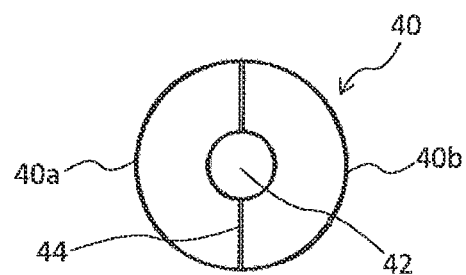
FIG. 15 is a plan view of a detector according to a first embodiment.

To address this issue, a detector 40 shown in FIG. 15 is used in the first embodiment. FIG. 15 is a plan view of the detector 40 according to the first embodiment. The detector 40 is formed in an annular shape with a through hole 42 defined at the center of the detector 40. The detector 40 is divided at a parting line 44 into two pieces of detectors 40a and 40b which are symmetric with respect to the parting line 44. A detection surface of the detector 40a and a detection surface of the detector 40b are of the same size and shape. The detectors 40a and 40b may be physically separated, or may not be physically separated.

The detectors 40a and 40b are placed at positions which are 180-degree rotational symmetric with respect to an optical axis along which the electron beam travels (i.e., the center of the through hole 42). Accordingly, the detection surface of the detector 40a and the detection surface of the detector 40b are arranged in 180-degree rotational symmetry about the optical axis of the electron beam. In this way, the detector 40 is configured to detect the reflected electrons on two detection surfaces arranged at 180-degree rotational symmetric positions (i.e., the detection surface of the detector 40a and the detection surface of the detector 40b).

Hereinafter, a quantity of signal from reflected electrons which are detected by the detector 40a is referred to as a signal quantity $I_A$, while a quantity of signal from reflected electrons which are detected by the detector 40b is referred to as a signal quantity $I_B$.

Figure 16:
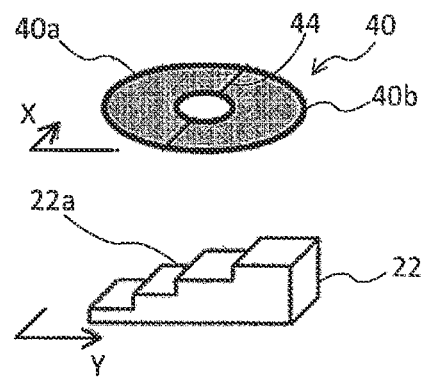
FIG. 16 is a perspective view showing the detector according to the first embodiment and a part of the specimen.

Directions are explained with reference to FIG. 16. FIG. 16 is a perspective view showing the detector 40 and a part of the specimen 22.

An extending direction of the parting line 44 for dividing the detector 40 into the detector 40a and the detector 40b is defined as an X direction. A rising direction in which the height of the stepwise region is increased on the surface of the specimen 22 (i.e., a stepping up direction of the step risers 22a) is defined as a Y direction. Alternatively, a descending direction of the stepwise region may be defined as the Y direction.

As shown in FIG. 16, for example, the detector 40 and the specimen 22 are disposed in an orientational relationship such that the X direction is perpendicular to the Y direction; i.e., the extending direction of the parting line 44 of the detector 40 is perpendicular to the stepping up or down direction of the step risers 22a, and the reflected electrons are detected in the detectors 40a and 40b.

Figure 17A:
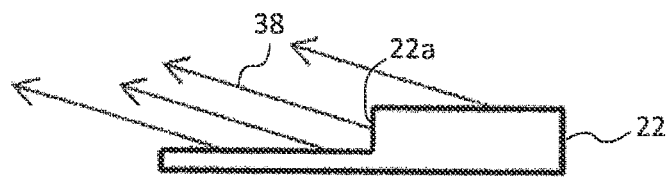
FIG. 17A is a cross sectional view of a part of the specimen.
Figure 17B:
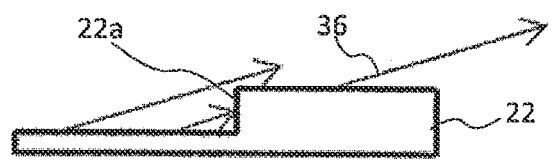
FIG. 17B is a cross sectional view of a part of the specimen.

Detection of the reflected electrons in the above-described state of the orientational relationship is explained with reference to FIGS. 17A and 17B. FIGS. 17A and 17B are cross sectional view showing a part of the specimen 22.

As shown in FIG. 17A, reflected electrons 38 released in the descending direction of the stepwise region travel without being blocked by the step riser 22a. Because the detector 40a is designed to detect the reflected electrons 38 released in this direction, the signal quantity $I_A$ is increased due to the presence of the step riser 22a.

On the other hand, as shown in FIG. 17B, reflected electrons 38 released in the rising direction of the stepwise region are blocked by the step riser 22a. Because the detector 40b is designed to detect the reflected electrons 38 released in this direction, the signal quantity $I_B$ is decreased due to the presence of the step riser 22a.

Accordingly, in a region around the step riser 22a, a difference between the signal quantity $I_A$ and the signal quantity $I_B$ is conspicuous. Meanwhile, in regions other than the region around the step riser 22a (i.e., flat regions), because there is no hinderance to reflected electrons, the difference between the signal quantity $I_A$ and the signal quantity $I_B$ is inconspicuous.

Because of such a phenomenon, the difference between the signal quantity $I_A$ and the signal quantity $I_B$ can be utilized for generating an image in which the step riser 22a is enhanced.

<Enhanced Representation of Step Riser>

The image in which the step riser 22a is enhanced can be obtained by means of the difference between the signal quantity $I_A$ and the signal quantity $I_B$ as described above, while in the image generated according to the above-described method, the step riser 22a may appear excessively bright or dark depending on the relationship between the extending direction of the parting line 44 of the detector 44 and the rising direction of the stepwise region. In such a case, it might be difficult for the user to recognize a portion of the image corresponding to the step riser 22a. To avoid this, it is necessary to perform a process to adjust brightness of the step riser 22a. Specifically, it may be considered, for example, that an absolute difference $I_S$ between the signal quantity $I_A$ and the signal quantity $I_B$ is calculated as shown in the below-described equation (9), and an image is generated using the calculated absolute difference $I_S$.

[Equation 9]

$$I_S(x,y)=|I_A(x,y)-I_B(x,y)| \quad (9)$$

In equation (9), variables x and y represent positions on the surface of the specimen 22.

In the region around the step riser 22a, because the difference between the signal quantity $I_A$ and the signal quantity $I_B$ is great, the step riser 22a can be brightened in the image by generating the image using the absolute difference $I_S$. On the other hand, when it is desired to darken the region around the step 22b, a value of the absolute difference $I_S$ added with a minus sign can be used for generating the image.

Figure 18:
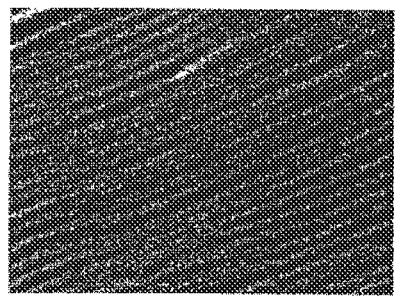
FIG. 18 is a diagram showing an SEM image.

An SEM image shown in FIG. 18 is generated based on the absolute difference $I_S$ obtained in a state where the X direction is perpendicular to the Y direction. In this state, the extending direction of the parting line 44 of the detector 40 is perpendicular to the rising direction of the stepwise region, and the step riser 22a is brightly represented.

Figure 19:
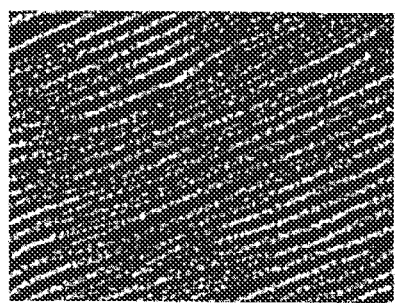
FIG. 19 is a diagram showing an SEM image.

In addition, a filtering process may be applied to the acquired SEM image. FIG. 19 shows an image obtained by applying a Gaussian filter to the SEM image shown in FIG. 18. As shown in FIG. 19, the step riser 22a is further enhanced by applying the filter.

Meanwhile, in a case where the specimen 22 is inclined relative to the detector 40; i.e., the detection surface of the detector 40 is not positioned in parallel with the surface of the specimen 22, use of equation (9) may not lead to enhanced representation of the step riser 22a. In this case, for example, an average value $I_{Amean}$ of the signal quantity $I_A$ and an average value $I_{Bmean}$ of the signal quantity $I_B$ may be calculated, and an image may be generated based on an absolute difference between a value of $(I_{A(x, y)}-I_{Amean})$ and a value of $(I_{B(x, y)}-I_{Bmean})$. In this case, a signal difference resulting from the inclination is compensated, which renders the step riser 22a easily recognizable.

Figure 20:
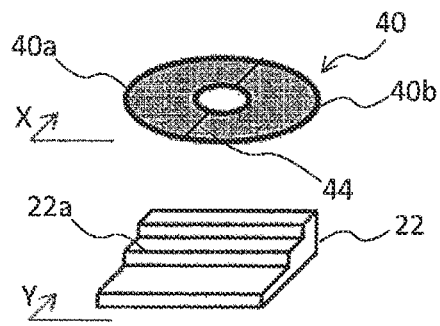
FIG. 20 is a perspective view showing the detector according to the first embodiment and a part of the specimen.
Figure 21:
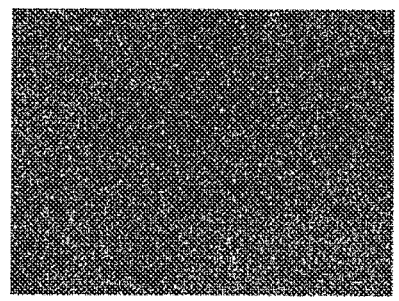
FIG. 21 is a diagram showing an SEM image.

Also depending on the relationship between the X direction and the Y direction; i.e., the relationship between the extending direction of the parting line 44 of the detector 40 and the rising direction of the stepwise region, the step riser 22a may be unrecognizably represented. For example, in a case where the extending direction of the parting line 44 of the detector 40 (the X direction) is aligned with the rising direction of the stepwise region (the Y direction) as shown in FIG. 20, because almost no difference is found between the signal quality $I_A$ and the signal quality $I_B$; i.e., the absolute difference $I_S$ is small, the step riser 22a does not appear in the resulting SEM image as shown in FIG. 21.

To circumvent such a problem, it may be considered to rotate a stage on which the specimen 22 is placed while observing an image being generated based on the absolute value $I_S$, until the specimen 22 is adjusted to an orientation where the step riser 22a is represented in an emphasized manner. Manual operation to adjust the orientation of the specimen 22 every time the specimen 22 is replaced with another one is a time-consuming task for the user. The operation to adjust the orientation may be automatically performed. A process of automatically performing the operation to adjust the orientation is described below.

<Rotation of Specimen Stage>

For example, it is necessary that the SEM image be acquired while the stage for the specimen 22 is rotated, to automatically determine whether the step riser 22a is visible in the SEM image. When standard deviations (of pixel values in the SEM images) are respectively calculated for the SEM image illustrated in FIG. 18 (in which the step riser 22a is represented in an enhanced manner) and the SEM image illustrated in FIG. 21 (in which the step riser 22a is not represented in the enhanced manner), a greater standard deviation is obtained for the SEM image illustrated in FIG. 18. Because of this, whether or not the relationship between the extending direction of the parting line 44 of the detector 40 and the rising direction of the stepwise region satisfies a condition which is optimum for representing the step riser 22a in the enhanced manner can be determined by calculating the standard deviations for SEM images which are acquired while rotating the stage, and evaluating the calculated standard deviations.

Specifically, the specimen 22, such as a wafer, is placed on the stage in such a manner that the surface of the specimen 22 can be observed even though the stage is rotated. The electron beam is focused on the surface of the specimen 22, and the stage retaining the specimen 22 is rotated by a predetermined angle, for example, in a range from 0° to 90°, and intermittently moved to positions separated by the predetermined angle. At each of the rotationally moved positions, the absolute difference $I_S$ is calculated from the signal quantities $I_A$ and $I_B$, and an image is generated based on the absolute difference $I_S$. In this way, images are acquired at the rotationally moved positions, and the standard deviation is calculated for each of the images. Then, a position at which a maximum value of the standard deviation is obtained is identified from the rotationally moved positions. The image in which the step riser 22a is enhanced can be obtained by setting the stage to the identified position. It should be noted that in addition to or instead of rotating the stage with the specimen 22, the detector 40 may be rotated. The angular relationship between the X direction and the Y direction may be changed by at least one of the specimen 22 and the detector 40.

<3D Reconstruction of Surface Structure>

The image representing the step riser 22a in the enhanced manner can be obtained by using the absolute difference $I_S$ defined by equation (9), while the rising direction of the stepwise region (the Y direction) on the surface of the specimen 22 cannot be identified. In other words, it is impossible to identify which one of flat portions across the step riser 22a is located at a position higher than the other one of the flat portions.

For identification of the rising direction of the stepwise region, a scanning electron microscope 10 according to the first embodiment is configured to reconstruct a three-dimensional shape of the surface of the specimen 22 using signals obtained from the detector 40 for acquiring a shape of the stepwise region including the step risers 22a.

To this end, the following equation (10) is defined.

[Equation 10]

$$I_s = \frac{I_A - I_B}{I_A + I_B} \quad (10)$$

As indicated in equation (10), the difference between the signal quantity $I_A$ and the signal quantity $I_B$ is normalized using the total signal quantity ($I_A+I_B$). When a normalized difference $I_S$ obtained by the equation (10) has a value of 0, the normalized difference $I_S$ indicates that a flat surface including no projections or depressions is present in a region around the position at which the electron beam is incident on the specimen 22. The normalized difference $I_S$ having values other than 0 indicates that projections or depressions are present is the region. When the region including projections or depressions has the stepwise shape, values of the normalized difference $I_S$ vary depending on a distance between the incident position of the electron beam and the step riser 22a and the height of the step riser 22a. In addition, the rising direction of the stepwise region can be found based on whether the normalized difference $I_S$ has a positive value or a negative value. In other words, a value corresponding to a change in height of the surface can be obtained. Values representing the surface shape of the specimen 22 can be obtained by integrating the normalized difference $I_S$.

Hereinafter, a structure of an apparatus for acquiring the surface shape and directions associated with the apparatus are described.

Figure 22:
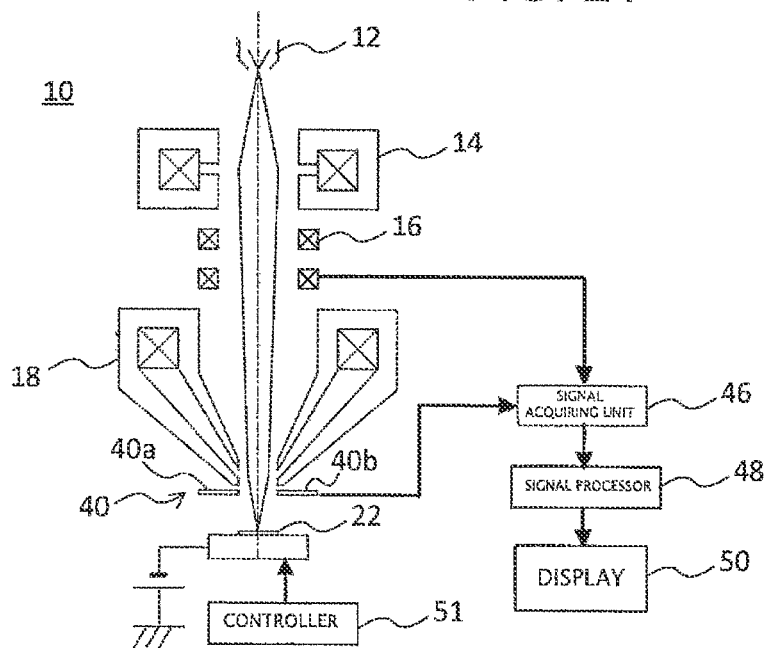
FIG. 22 is a diagram showing a structure of a scanning electron microscope according to the first embodiment.

FIG. 22 shows components of the scanning electron microscope 10 according to the first embodiment. The scanning electron microscope 10 is configured to irradiate the specimen 22 with an electron beam and detect reflected electrons released from the specimen 22 for generating an image.

The scanning electron microscope 10 includes, as in the case of the scanning electron microscope 100 illustrated in FIG. 1, the electron gun 12 which generates the electron beam, the group of lenses including the focusing lens 14, the deflection lens 16, and the objective lens 18, and the group of coils including the deflection coil and the scanning coil. Here, the electron gun 12, the group of lenses, and the group of coils constitute an exemplary electron beam irradiation apparatus which irradiates the specimen 22 with the electron beam while scanning the electron beam on the specimen 22. Further, the scanning electron microscope 10 includes, in place of the detector 20, the detector 40 illustrated in FIG. 15. The electron gun 12, the focusing lens 14, the deflection lens 16, the objective lens 18, the detector 40, and the specimen 22 are arranged in that order. The scanning electron microscope 10 is able to apply a negative voltage of several kilovolts to the specimen 22. The scanning electron microscope 10 may include a secondary electron detector which detects secondary electrons generated in the specimen 22.

The specimen 22 is placed in the specimen chamber. In the specimen changer, a stage is installed, and the specimen 22 is placed on the stage. The stage may be movable in three dimensions (within a plane and in a height direction) along an x axis, a y axis, and a z axis, or may be movable in two dimensions (within the plane). The stage is further configured to be rotatable. The stage may include an arrangement capable of inclining the specimen 22 while maintaining the specimen 22 in position.

The scanning electron microscope 10 further includes the replacement chamber for replacing specimens 22 to be placed within the specimen chamber, the vacuum pumping system for reducing pressure in the inside of the specimen chamber, and other components, which are not illustrated in FIG. 22.

The scanning electron microscope 10 includes a signal acquiring unit 46, a signal processor 48, the display 50, and the controller 51.

The electron beam generated by the electron gun 12 is irradiated onto the specimen 22. The electron beam is focused through the group of lenses including the focusing lens 14, the deflection lens 16, and the objective lens 18 onto the surface of the specimen 22, and scanned thereon by the scanning coil. The reflected electrons and the secondary electrons are released from the specimen 22 through irradiation with the electron beam.

The detector 40 is disposed above the specimen 22 (i.e., on an electron gun 12 side), and configured to detect the reflected electrons released from the specimen 22. The detector 40 is, for example, a semiconductor detector. The reflected electrons released from the specimen 22 are incident upon the detector 40 and detected therein. Specifically, the reflected electrons are detected by either the detector 40a or the detector 40b, depending on the release angles of the reflected electrons. Electric signals are generated upon detection of the reflected electrons, and subsequently acquired as data of scanned positions of the electron beam and the signal quantity by the signal acquiring unit 46. The data acquired by the signal acquiring unit 46 is output to the signal processor 48.

The signal processor 48 generates the image based on the data transmitted from the signal acquiring unit 46. The generated image is displayed on the display 50. For example, the signal processor 48 calculates the shape of the surface of the specimen 22, and causes the display 50 to display the calculated result.

The signal processor 48 performs a calculation for obtaining the standard deviation of the image and the calculation according to equation (10). The signal processor 48 may be configured to perform the calculation according to equation (9).

The controller 51 controls each component in the scanning electron microscope 10. For example, the controller 51 controls rotation of the stage on which the specimen 22 is placed. For example, an arrangement including a motor, for example, for rotating the stage is installed in the scanning electron microscope 10, and the controller 51 controls rotation of the motor to control rotation of the stage. In this way, the controller 51 controls rotation of the specimen 22. For example, the scanning electron microscope 10 irradiates the specimen 22 with the electron beam while rotating the specimen 22 to obtain the SEM image. Further, the controller 51 performs calculations according to equations (1) to (8), and causes the display 50 to display the above-described "Detectable Angle Range from θ1° to θ2°".

Apparatuses, such as the signal acquiring unit 46, the signal processor 48, and the controller 51, may be cooperatively implemented by hardware and software, for example. Specifically, the apparatuses are equipped with one or more processors, such as a CPU. The functions of the apparatuses are implemented when programs stored in an unillustrated storage are read and executed by the one or more processors. For example, the apparatuses may be composed of a personal computer (PC). Alternatively, components in the apparatuses may be implemented by hardware resources, such as a processor, an electronic circuit, and an ASICs (Application Specific Integrated Circuit). For such implementation, a device, such as a memory, may be utilized. Further alternatively, the components in the apparatuses may be implemented by a DSP (Digital Signal Processor), an FPGA (Field Programmable Gate Array), and the like.

Figures 23, 24, 25:
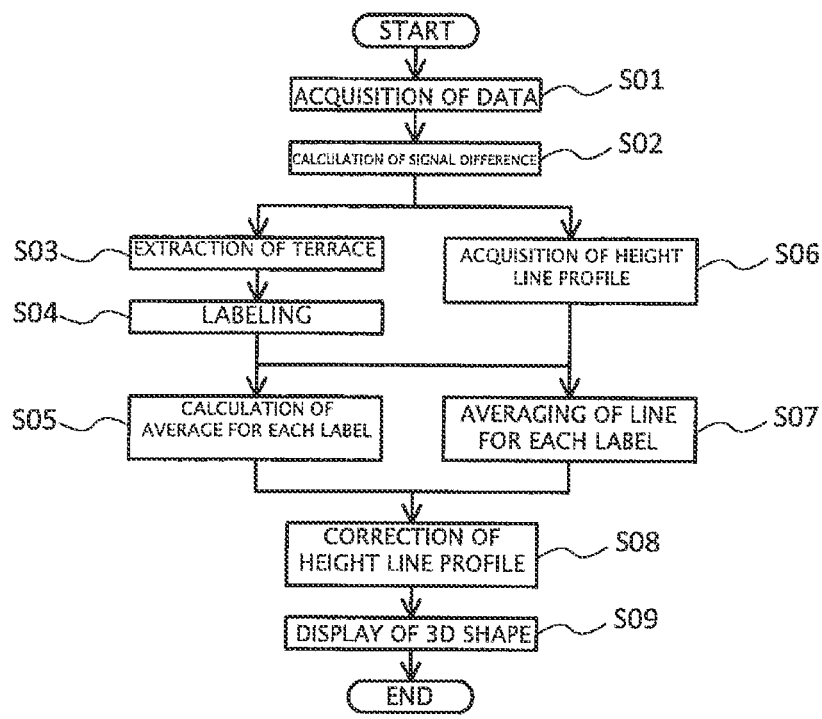
FIG. 23 is a flowchart showing a flow of a process performed by a signal processor.
FIG. 24 is a diagram showing an example of a map of signal differences.
FIG. 25 is a diagram showing an example of a map of heights.

The signal processor 48 performs a process in accordance with a flowchart shown in FIG. 23. Initially, the signal processor 48 acquires data from the signal acquiring unit 46 (S01) and calculates the signal difference (S02) using an equation (11), which will be described below. Then, the signal processor 48 extracts terraces (S03), performs a labeling process (S04), and calculates an average value on a label-by-label basis (S05). The terraces refer to regions other than the step risers 22a (i.e., flat regions) on the surface of the specimen 22. Details of the labeling process and the calculation of the average value will be explained below. Further, the signal processor 48 acquires a height line profile (S06) and performs leveling of the line on the label-by-label basis (S07). The height line profile and the leveling will be described in detail further below. Then, the signal processor 48 compensates for the height line profile (S08) and displays the image of a three-dimensional shape (S09).

Hereinafter, each process step performed by the signal processor 48 is described in detail.

The specimen 22 is set in the scanning electron microscope 10, and the observation conditions for enabling observation of step risers 22a formed on the surface of the specimen 22 are established. That is, the observation conditions are established such that the X direction is defined to be perpendicular to the Y direction for enabling acquisition of the SEM image illustrated in FIG. 18 (in which the step risers 22a are clearly shown). Specifically, as described in the Rotation of Specimen Stage section, the scanning electron microscope 10 irradiates the surface of the specimen 22 with the electron beam, and the controller 51 causes the specimen stage to be rotated by the predetermined angle in the range between 0° and 90° and moved to the positions separated by the predetermined angle. In this way, the signal quantities $I_A$ and $I_B$ and the difference $I_S$ are obtained at each of the rotationally moved positions. Images are generated based on the values of the difference $I_S$, the standard deviation is calculated for each of the images, and the stage is set to the position at which the maximum standard deviation is obtained. In this state, the image in which the step risers 22a are enhanced will be obtained.

Then, the scanning electron microscope 10 detects the reflected electrons from the specimen 22 while scanning the electron beam to acquire the signal. The signal acquiring unit 46 acquires the signal quantity $I_A(x, y)$ and the signal quantity $I_B(x, y)$ at each scanned position (x, y) of the electric beam. In other words, the signal quantities $I_A(x, y)$ and $I_B(x, y)$ are acquired by the signal acquiring unit 46 at each position (x, y) where the electron beam is incident onto the specimen 22.

The signal processor 48 calculates the signal difference $I_S(x, y)$ between the signal quantities $I_A$ and $I_B$ using the following equation (11).

[Equation 11]

$$I_s(x, y) = \frac{I_A(x, y) - I_B(x, y)}{I_A(x, y) + I_B(x, y)} \tag{11}$$

FIG. 24 shows an example of a map of the signal difference $I_S(x, y)$. In the map of FIG. 24, values of the signal difference $I_S(x, y)$ are indicated in connection with scanned positions (x, y). Reference letters x and y in FIG. 24 correspond to the variables x and y of the scanned position (x, y) on the specimen 22.

<Height Calculation>

Next, the signal processor 48 calculates, based on the signal difference $I_S(x, y)$, a height of the surface of the specimen 22 at each scanned position (x, y). It should be noted that the height at each scanned position (x, y) is a height which is defined relative to a predetermined reference height.

For example, the signal processor 48 calculates a height with respect to each of rows r=0, 1, . . . , by integrating the differences $I_S$ with respect to the x direction for each of the rows y=0, 1, . . . according to the following equation (12).

[Equation 12]

$$Z(x) = k \int I_S(x) dx \tag{12}$$

In equation (12), a letter k represents a coefficient used for correcting the height, and the coefficient k varies depending on the observation conditions. The coefficient k is further explained below.

For example, a height of the surface of a specimen that has already been measured and known by another height measurement means (such as, for example, a scanning probe microscope (SPM)) is calculated in accordance with equation (12) taking the coefficient k as k=1. A height calculated here will be different from the know height obtained by the other height measurement means. Then, a value of the coefficient k with which equation (12) yields a height equal to the known height measured by the other height measurement means is sought while substituting different values for the coefficient k. Then, under the same observation conditions, a specimen whose height is unknown can be measured, and the height of the specimen can be calculated in accordance with equation (12) using the found value of the coefficient k. In this way, calculation of the unknown height of the specimen can be achieved.

Meanwhile, the step and terrace structure of the surface of the semiconductor wafer is formed by crystal constituting the semiconductor wafer. Therefore, the semiconductor wafer has a feature that the step riser has a height reflecting a crystal lattice when the crystal has no distortion. When it is known that a step riser having a height equivalent to one atomic layer is present in the field of view, the feature can be used for determining the value of the coefficient k in such a manner that a height of a lowest step riser matches equal to a height of one atomic layer. In this way, a true height is calculated.

FIG. 25 shows heights which are calculated based on the signal difference $I_S(x, y)$ shown in FIG. 24 in accordance with equation (12) taking the coefficient k as k=0.2. The values of (x, y) in FIG. 25 correspond to the scanned positions (x, y) on the specimen 22.

<Height Correction>

Figure 26:
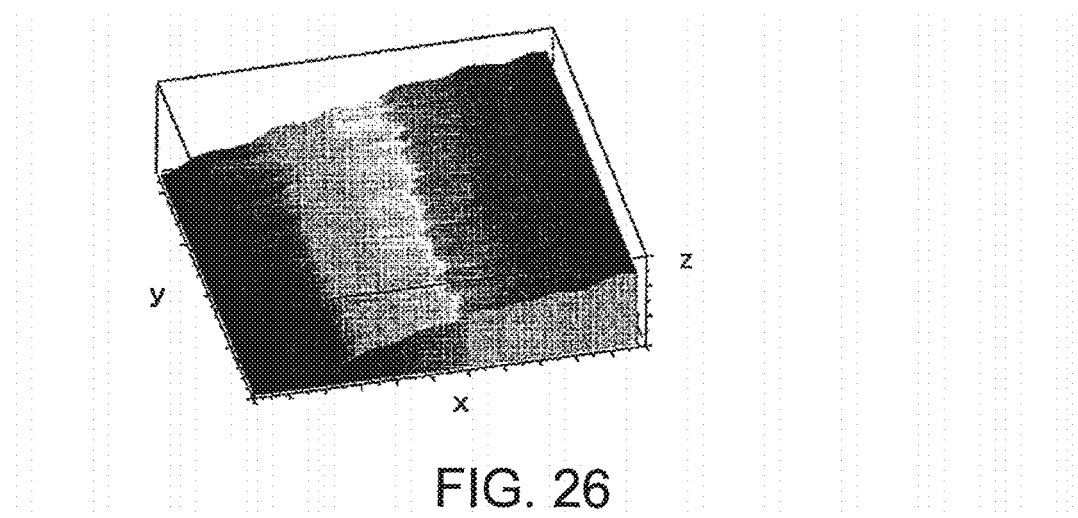
FIG. 26 is a diagram showing a three-dimensional shape of a surface of the specimen.

The height $Z(x, y)$ includes an error. The error is explained with reference to FIG. 26. FIG. 26 shows the three-dimensional shape of the surface of the specimen 22. Heights of the surface are represented with shades of gray. The heights shown in FIG. 26 are calculated by equation (12). The surface of the specimen 22 has a stepwise shape whose height is increased from left to right in the x direction, while the stepwise shape remains at the same height in the y direction. However, projections and depressions are formed in the y direction, and an actual stepwise shape is not precisely represented. Hereinafter, a method for correcting the height including an error to calculate the actual stepwise shape is described.

In the step and terrace structure on the semiconductor wafer, the terrace (flat) regions are flat on an atomic level. Using this feature, the signal processor 48 extracts a flat region and levels heights of the flat region. In this way, the heights are corrected. A process of correcting height is explained in detail below.

<Extraction of Flat Region>

The signal processor 48 determines, based on a value of the signal difference $I_S(x, y)$ at each scanned position, whether or not the surface of the specimen 22 is flat at the scanned position. When the signal difference $I_S(x, y)$ has a value of 0, the reflected electrons are evenly incident on the detectors 40a and 40b. Therefore, a scanned position at which the signal difference $I_S(x, y)$ of 0 is obtained can be regarded as a flat region. In practice, because a signal may include noise, the signal processor 48 specifies a threshold value, and determines from the absolute value of the signal difference $I_S(x, y)$ at a scanned position that the scanned position is in the flat region when the absolute difference $I_S(x, y)$ obtained for the scanned position is equal to or smaller than the threshold value.

Figure 27:
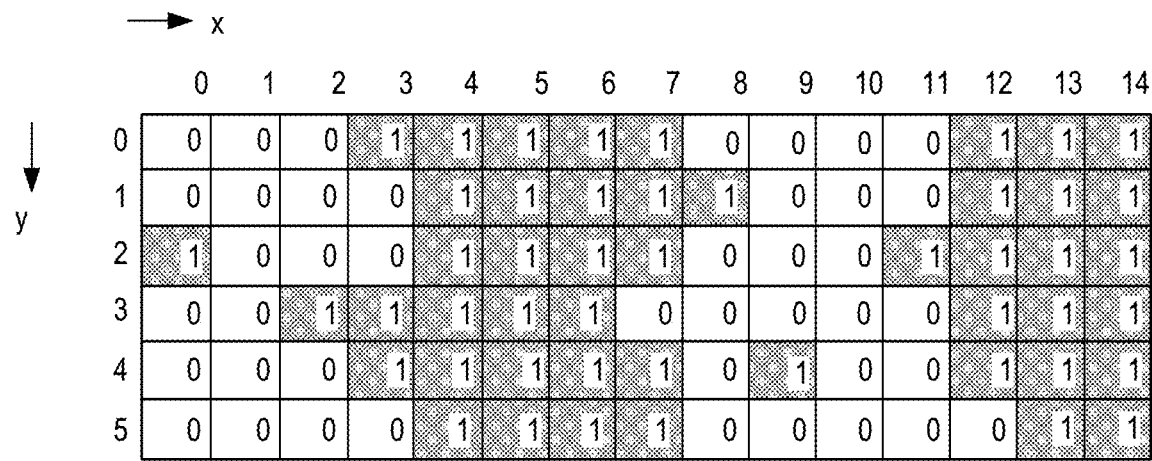
FIG. 27 is a diagram showing a result of extracting flat regions.

For example, from the values of the signal difference $I_S(x, y)$ shown in FIG. 24, the signal processor 48 extracts, as flat regions, scanned positions (x, y) having the signal difference $I_S(x, y)$ whose absolute value is equal to or smaller than the threshold value (of 0.2 in this example). FIG. 27 shows the result of extraction. In FIG. 27, an area consisting of scanned positions assigned a value "1" corresponds to the flat region, and an area consisting of scanned positions assigned a value "0" corresponds to a region where the absolute value of the signal difference $I_S(x, y)$ exceeds the threshold value.

In areas extracted as flat regions, an area composed of continuously adjoining scanned positions having the value "1" is basically considered to be of the same height. Meanwhile, a scanned position (x=0, y=2) and a scanned position (x=9, y=4) are independent without being adjoined to any other scanned positions having the value "1". These independent scanned positions have no counterpart positions having heights to be equalized together. Then, the signal processor 48 filters out the independent scanned positions and reassigns the value "0" to the filtered independent scanned positions.

<Labeling Process>

Next, the signal processor 48 defines the area composed of the continuously adjoining scanned positions having the value "1" as one group and performs labeling on defined groups. Specifically, after defining groups based on the area in which the value "1" continues, the signal processor 48 assigns a unique label to each of the groups. For this labeling process, any well-known labeling technique may be employed.

Figure 28:
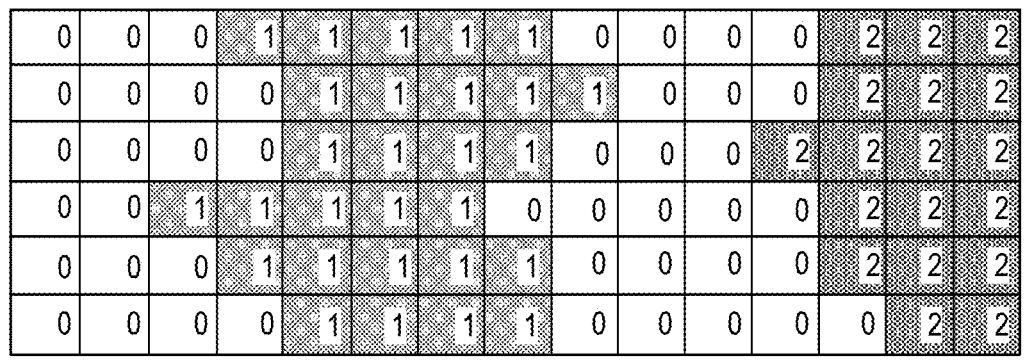
FIG. 28 is a diagram showing a result of labeling.

For example, the signal processor 48 performs filtering processing on the extracted result shown in FIG. 27, and subsequently performs labeling processing on the filtered extracted result. FIG. 28 shows an example of the result of the labeling processing. In the example shown in FIG. 28, one of the groups is assigned a label '1', and another one of the groups is assigned a label '2'. In this way, each of the flat regions is grouped based on the area composed of continuously adjoining scanned positions, and the label is assigned to each of the groups. It should be noted that a label '0' is assigned to the area in which the absolute signal difference $I_S(x, y)$ exceeds the threshold value (i.e., the area consisting of the value "0" in FIG. 27). Hereinafter, the group assigned the label '1' is referred to as Group 1, and the group assigned the label '2' is referred to as Group 2.

<Hight Correction Process>

Next, a process of equalizing heights on a group-by-group basis is explained. FIG. 29 shows heights at the scanned position (x, y) identical to those shown in FIG. 25.

The signal processor 48 calculates an average of the heights for each of the groups. Specifically, the signal processor 48 extracts heights of scanned positions (x, y) belonging to Group 1 assigned the label '1', and calculates an average of the extracted heights of Group 1. Similarly, the signal processor 48 extracts heights of scanned positions (x, y) belonging to Group 2 assigned the label '2', and calculates an average of the extracted heights of Group 2.

An overall average height $Z_{m1}$ of Group 1 is approximately 14.86, and an overall average height $Z_{m2}$ of Group 2 is approximately 29.22.

The signal processor 48 corrects heights in each row of y=0, 1, . . . , using the average of the heights.

Firstly, the signal processor 48 extracts, from scanned positions (x, y) in a row of y=0, those belonging to group 1, and calculates an average of heights of the extracted scanned positions (x, y) as an average height $Z_{m1y0}$ of the extracted scanned positions (x, y) in the row y=0.

Secondly, the signal processor 48 corrects each of the heights of the scanned positions (x, y) belonging to Group 1 in the row of y=0 in such a manner that the average height $Z_{m1y0}$ obtained from corrected heights in the row y=0 becomes equal to the overall average height $Z_{m1}$ of Group 1. Specifically, the signal processor 48 corrects each of the heights of the scanned positions (x, y) belonging to Group 1 in the row y=0 as indicated in the following equation (13) where reference sign Z' (x) represents a corrected height.

[Equation 13]

$$Z'(x) = Z_{m1y0} \cdot \frac{Z(x)}{Z_{m1}} \quad (13)$$

The signal processor 48 performs similar processing on those belonging to Group 2 in the row y=0. That is, the signal processor 48 corrects each of heights of scanned positions (x, y) belonging to Group 2 in the row y=0 in such a manner that the average height $Z_{m2y0}$ obtained from corrected heights in the row y=0 becomes equal to the overall average height $Z_{m2}$ of Group 2.

FIG. 30 shows the corrected heights in the row of y=0. When compared to FIG. 29, it can be seen in FIG. 30 that heights of the scanned positions (x, y) are corrected in both Groups 1 and 2.

The signal processor 48 performs correction of heights in each row of y=1, 2, . . . , in a manner similar to that performed for the row of y=0. As a result, heights of the scanned positions (x, y) are corrected in each of Groups 1 and 2. FIG. 31 shows the corrected heights, in which the heights of the scanned positions of Groups 1 and 2 are corrected in each of the rows of y=0, 1, 2, . . . , on a group-by-group basis. Specifically, the signal processor 48 corrects heights of scanned positions belonging to Group 1 in the row y=1 in such a manner that an average height $Z_{m1y1}$ obtained from corrected heights belonging to Group 1 in the row y=1 becomes equal to the overall average height $Z_{m1}$ of Group 1. The same processing is performed for Group 1 in the row y=2 and subsequent rows. The same is applied to Group 2.

As shown in FIG. 31, the heights of the scanned positions belonging to the same group being extracted as the same flat region have values close to each other. That is, the heights of the scanned positions belonging to Group 1 have values close to each other, and those belonging to Group 2 also have values close to each other.

As a result of the height correction process, the heights of the flat region are equalized. Hereinafter, a process for correcting heights of a region other than the flat region (mainly a region of the step riser) is explained.

Initially, the signal processor 48 extracts scanned positions (x, y) located at ends of each of the areas extracted as the flat regions and a scanned position (x, y) which is located at an end of the image and not contained in the flat region. In this example, scanned positions (x, y) where x=0, 3, 7, and 12 are extracted. It should be noted that the scanned positions (x, y) extracted in each row are circled by broken lines in FIG. 32.

Then, the signal processor 48 creates, from the extracted scanned positions (x, y) in each row, a pair of scanned positions (x, y) which sandwich therebetween a region other than the flat region. In the row of y=0, scanned positions (0, 0) and (3, 0) constitute a pair, and scanned positions (7, 0) and (12, 0) constitute another pair. Here, in the pair of scanned positions (x, y), a coordinate x of the left scanned position (x, y) is referred to as a coordinate x1, and a coordinate x of the right scanned position (x, y) is referred to as a coordinate x2. The signal processor 48 corrects heights of the region other than the flat region using uncorrected heights and corrected heights at these coordinates.

In the pair of the scanned position (0, 0) and the scanned position (3, 0), an uncorrected height Z(x1) of the scanned position (0, 0) (i.e., an uncorrected height at a coordinate x1=0) is 3, and its corrected heigh Z'(x1) is 3. Here, because the scanned position (0, 0) is not contained in the flat region, the corrected height of the scanned position (0, 0) is equal to the uncorrected height thereof. Meanwhile, an uncorrected height Z(x2) of the scanned position (3, 0) (an uncorrected height at a coordinate x=3) is equal to 11, and its corrected height Z'(x2) is equal to 15. The signal processor 48 uses these values to calculate coefficients a and b used in an equation for correcting heights as shown in the following equations (14) and (15).

[Equation 14]

$$a = \frac{Z(x1) - Z'(x1) - Z(x2) + Z'(x2)}{x1 - x2} \quad (14)$$

[Equation 15]

$$b = Z(x1) - Z'(x1) - a \cdot x1 \quad (15)$$

The signal processor 48 corrects heights using the coefficients a and b in the following equation (16).

[Equation 16]

$$Z'(x) = Z(x) - (ax + b) \quad (16)$$

The above-described correction processing corrects a quantity of inclination of a step (i.e., a step riser) in a state in which the uneven shape of the surface of the specimen 22 is reflected.

FIG. 33 shows values of the coefficients a and b in each row of y=0, 1, 2, . . . that are calculated for the region from x=0 to the end (x=3 in row y=0) of Group 1. FIG. 34 shows values of the coefficients a and b calculated for a region from the end of Group 1 (x=7 in the row y=0) to the end of Group 2 (x=12 in the row y=0).

The signal processor 48 corrects, in the row y=0, heights of scanned positions (x, y) contained in a range of 0<x<3 using the coefficients a=−1.22 and b=0 according to equation (16), and corrects heights of scanned positions (x, y) contained in a range of 7<x<12 using the coefficients of a=0.02 and b=−3.80 according to equation (16). Then, the signal processor 48 performs the same correction processing on the subsequent rows y=1, 2, and so on. In this way, the heights of the region other than the flat region are corrected. FIG. 35 shows corrected heights of all of the scanned positions (x, y).

Figure 36:
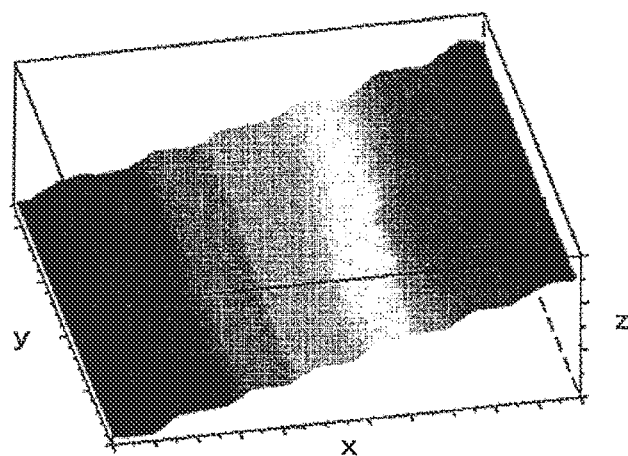
FIG. 36 is a diagram showing a corrected three-dimensional shape.

FIG. 36 shows a three-dimensional shape of the surface of the specimen 22 that is obtained after height correction. The three-dimensional shape illustrated in FIG. 36 is obtained by applying height correction to the three-dimensional shape illustrated in FIG. 26.

As is evident from comparison between the three-dimensional shape obtained before height correction (illustrated in FIG. 26) and the three-dimensional shape obtained after height correction (illustrated in FIG. 36), terrace regions on the surface of the specimen 22, which is the semiconductor wafer, are smoothened by the correction, while the step shape is rendered easily recognizable.

It is difficult to place the specimen 22 and the detector 40 at positions where the detection surface of the detector 40 is located precisely in parallel to the flat regions on the surface of the specimen 22 being the semiconductor wafer. Accordingly, equation (9) does not always yield a value of 0 for the flat region. When the value of 0 is not obtained for the flat region on the surface of the specimen 22, the signal processor 48 corrects the signal quantities $I_A$ and $I_B$ so as to obtain the value of 0 for the flat region from equation (9).

For example, a flat region is specified by the user, and the signal processor 48 corrects the signal quantities $I_A$ and $I_B$ using values at scanned positions (x, y) corresponding to the specified flat region.

Initially, the signal processor 48 calculates the absolute difference $I_S(x, y)$ using equation (9), generates an image using the calculated absolute difference $I_S(x, y)$, and operates the display 50 to display the generated image. The user identifies the step shape on the surface of the specimen 22 while viewing the displayed image, and specifies a scanned position $(x_p, y_p)$ corresponding to the flat region.

The signal processor 48 corrects the signal quantities $I_A$ and $I_B$ to signal quantities $I_A'$ and $I_B'$ using signal quantities $I_A(x_p, y_p)$ and $I_B(x_p, y_p)$ at the specified scanned position $(x_p, y_p)$ according to the following equations (17) and (18).

[Equation 17]

$$I_A'(x, y) = \frac{I_A(x, y)}{I_A(x_p, y_p)} \frac{I_A(x_p, y_p) + I_B(x_p, y_p)}{2} \quad (17)$$

[Equation 18]

$$I_B'(x, y) = \frac{I_B(x, y)}{I_B(x_p, y_p)} \frac{I_A(x_p, y_p) + I_B(x_p, y_p)}{2} \quad (18)$$

The signal processor 48 calculates a difference $I_S'$ between the corrected signal quantities $I_A'$ and $I_B'$. In this way, a smaller signal difference can be obtained for the flat region.

It should be noted that the user may specify two or more scanned positions (x, y), and the signal processor 48 may calculate an average of signal quantities $I_A$ at the specified two or more scanned positions (x, y) and an average of signal quantities $I_B$ at the specified two or more scanned positions (x, y). In this case, the calculated averages are substituted for the signal quantities $I_A(x_p, y_p)$ and $I_B(x_p, y_p)$ in equations (17) and (18), respectively.

According to the above-described first embodiment, the two-piece detector 40 (consisting of the detectors 40a and 40b) is used for detecting the reflected electrons released from the specimen 22 while radiating the electron beam onto the specimen 22 and rotating the specimen 22. As a result, the difference in the signal quantity between the signal from reflected electrons detected by the detector 40a and the signal from reflected electrons detected by the detector 40b can be calculated and evaluated to identify the angle of rotation for the specimen 22 to be set at the position where the image representing enhanced steps can be obtained. Then, the specimen 22 is rotated by the identified angle of rotation. At the rotated position, an image representing enhanced steps can be obtained by detecting the reflected electrons.

Further, based on the obtained difference in the signal quantity, the heights of the surface of the specimen 22 can be calculated and corrected (see FIG. 36) through the height correction process including the labeling and extraction of flat regions.

Still further, the range of release angles of the reflected electrons detectable with the detector 40 can be calculated based on the energy of the electron beam, the bias voltage applied to the specimen, and the distance between the specimen 22 and the detector 40, and the calculated range can be presented to the user.

In addition, when the user selects two parameters from the parameters consisting of the energy of the electron beam, the bias voltage applied to the specimen 22, and the distance between the specimen 22 and the detector 40, the remaining parameter needed to detect the reflected electrons released from the specimen 22 at angles in the presented range of release angles can be automatically calculated. Accordingly, the user does not need to manually specify all of the parameters.

Second Embodiment

Hereinafter, a scanning electron microscope according to a second embodiment will be explained. In the second embodiment, a four-piece detector 50 is used in place of the two-piece detector 40.

The use of the detector 40 according to the first embodiment involves adjusting the relationship between the direction of the parting line 44 of the detector 40 (the X direction) and the rising direction of the stepwise region on the surface of the specimen 22 (the Y direction), and thus rotating the specimen stage to adjust the relationship. When a detector 52 according to the second embodiment is used, the image in which step risers are emphasized can be generated without the necessity of adjusting the relationship between a direction of a parting line of the detector 52 and the rising direction of the stepwise region (the Y direction) on the surface of the specimen 22, and thus without the necessity of rotating the specimen stage.

Figure 37:
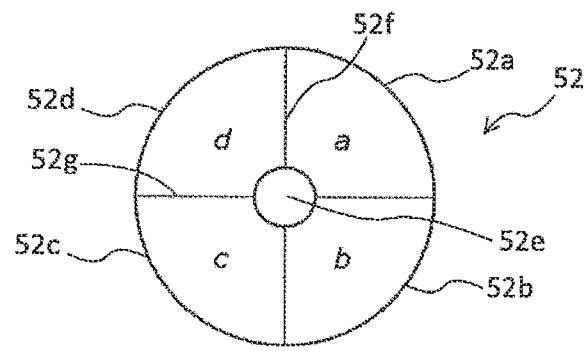
FIG. 37 is a plan view showing a detector according to a second embodiment.

Hereinafter, the detector 52 according to the second embodiment is explained with reference to FIG. 37. FIG. 37 shows a plan view of the detector 52.

The detector 52 is formed in an annular shape with a through hole 52e in the center thereof. A detection surface of the detector 52 is divided into four detectors by parting lines 52f and 52g which are perpendicular to each other, and the detector 52 has detection surfaces 52a, 52b, 52c, and 52d. The parting line 52f separates the detection surfaces 52a and 52b from the detection surface 52d and 52c, respectively, and the parting line 52g separates the detection surfaces 52a and 52d from the detection surfaces 52b and 52c, respectively. The detection surfaces 52a, 52b, 52c, and 52d are placed in rotation symmetric positions with respect to the optical axis of the electron beam (i.e., the center of the through hole 52e) that is taken as an axis of rotation. For example, the detection surfaces 52a, 52b, 52c, and 52d are arranged in that order in a circumferential direction of the detector 52, and the four detectors are placed at positions which are 90-degree rotational symmetric with respect to the optical axis taken as the axis of rotation. It should be noted that the detection surfaces may or may not be physically spaced from each other. In the example shown in FIG. 37, the detection surfaces 52a, 52b, 52c, and 52d are of the same shape and size.

Hereinafter, quantities of signals from reflected electrons detected on the detection surfaces 52a, 52b, 52c, and 52d are referred to as signal quantities $I_a$, $I_b$, $I_c$, and $I_d$, respectively.

Using the detector 52 configured as described above, the image in which the step risers are enhanced can be generated without the necessity of adjusting the relationship between the direction of the parting line 52f or 52g in the detector 52 and the rising direction of the stepwise region on the surface of the specimen 22. Meanwhile, as in the case of the first embodiment, the reflected electrons may be detected while rotating the specimen stage, to find an angle of rotation and rotate the specimen stage by the found angle so as to be set at the position where the greatest signal difference is obtained. In this case, because a range of the angle of rotation necessitated by the detector 52 is narrower than a range of the angle of rotation necessitated by the two-piece detector 40, the angle of rotation can be adjusted within a shorter time.

Figure 38:
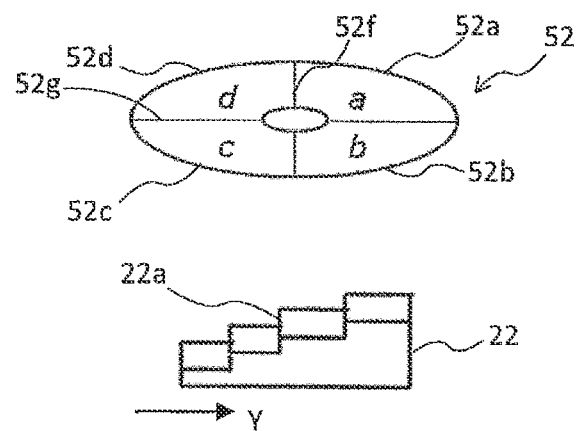
FIG. 38 is a perspective view showing the detector according to the second embodiment and a part of the specimen.
Figure 39:
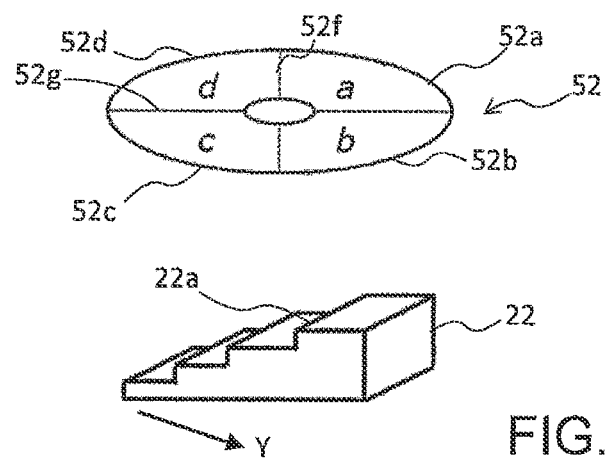
FIG. 39 is a perspective view showing the detector according to the second embodiment and a part of the specimen.

Referring to FIGS. 38 and 39, the reason why the image in which the step risers are emphasized can be generated without adjusting the relationship between the direction of the parting line of the detector 52 and the rising direction of the stepwise region (the Y direction) on the surface of the specimen 22 is explained below. FIGS. 38 and 39 are perspective views showing the detector 52 and a part of the specimen 22.

As shown in FIG. 38, the extending direction of one of the parting lines (the parting line 52f in the example shown in FIG. 38) of the detector 52 is perpendicular to the rising direction of the stepwise region (the Y direction) on the surface of the specimen 22. In other words, the other of the parting lines (the parting line 52g in the example shown in FIG. 38) is parallel to the Y direction. In this case, the signal processor 48 divides the detection surfaces of the detector 52 into detection surface pairs consisting of a pair of detection surfaces located on an upper step side of the step riser 22a and a pair of detection surfaces located on a lower step side of the step riser 22a, calculates a total signal quantity of each of the pairs, and calculates a signal difference between the total signal quantity of the upper pair and the total signal quantity of the lower pair. Then, the signal processor 48 generates an image representing the calculated signal difference and causes the display 50 to display the generated image.

In the example shown in FIG. 38, the detection surfaces 52a and 52b located on the upper step side constitute one pair, and the detection surfaces 52c and 52d located on the lower step side constitute another pair. The total signal quantity of the upper pair is $(I_a+I_b)$, and the signal quantity of the lower pair is $(I_c+I_d)$.

On the other hand, when the parting line 52f or 52g of the detector 52 is not perpendicular to the Y direction or not in parallel with the Y direction as shown in FIG. 39, the signal processor 48 calculates a signal difference between signal quantities detected by two detection surfaces of the detector 52 which are disposed on 180-degree rotational symmetric positions with respect to the center of the through hole 52e taken as the axis of rotation. For example, the signal processor 48 uses the signal quantity $I_b$ of the detection surface 52b and the signal quantity $I_d$ of the detection surface 52d to calculate the signal difference, generates an image representing the calculated signal difference, and causes the display 50 to display the image.

As described above, whichever direction the rising direction of the stepwise region (the Y direction) extends relative to the parting line 52f or 52g in the detector 52, the signal difference can be calculated, and a three-dimensional shape of the surface of the specimen 22 can accordingly be obtained.

When the detector 52 is arranged with one of the parting lines 52f and 52g being perpendicular to the Y direction as shown in FIG. 38, a detection surface area capable of detecting the reflected electrons in FIG. 38 is double a detection surface area in positional arrangement shown in FIG. 39, which can help improve the SN value of the signal. Specifically, in positional arrangement shown in FIG. 38, the total signal quantity $(I_a+I_b)$ and the total signal quantity $(I_c+I_d)$ are used to calculate the signal difference, whereas in positional arrangement shown in FIG. 39, the signal quantity $I_b$ and the signal quantity $I_d$ are used to calculate the signal difference. Therefore, in the positional arrangement shown in FIG. 38, the signal difference can be calculated using the doubled signal quantity relative to the signal quantity used in the positional arrangement shown in FIG. 39.

<Display of Emphasized Step Riser>

Even though the four-piece detector 52 is used, the step risers 22a can also be represented in the enhanced manner. For example, a maximum value among the signal quantities $I_a$, $I_b$, $I_c$, and $I_d$ is defined as a maximum signal quantity $S_{max}$, and a minimum value among the signal quantities $I_a$, $I_b$, $I_c$, and $I_d$ is defined as a minimum signal quantity $S_{min}$. The signal processor 48 finds the maximum and minimum signal quantities $S_{max}$ and $S_{min}$ for each of the scanned positions (x, y), calculates a difference $I_S(x, y)$ between the maximum and minimum signal quantities $S_{max}$ and $S_{min}$, and generates an image representing the calculated difference $I_S(x, y)$. In this way, the image in which the step risers 22a are clearly represented can be obtained.

The maximum signal quantity $S_{max}$ is defined as shown in the below-described equation (19), the minimum signal quantity $S_{min}$ is defined as shown in the below-described equation (20), and the difference $I_S(x, y)$ is defined as shown in the below-described equation (21).

[Equation 19]

$$s_{max}(x,y)=\max(I_a(x,y),I_b(x,y),I_c(x,y),I_d(x,y)) \qquad (19)$$

[Equation 20]

$$s_{min}(x,y)=\min(I_a(x,y),I_b(x,y),I_c(x,y),I_c(x,y),I_d(x,y)) \qquad (20)$$

[Equation 21]

$$I_S(x,y)=s_{max}(x,y)-s_{min}(x,y) \qquad (21)$$

Equations other than the equation (21) may be employed. For example, the signal processor 48 may calculate the signal difference as shown in the following equations (22) and (23) and generate an image representing the signal difference.

[Equation 22]

$$s_1(x,y)=|(I_a+I_b)-(I_c+I_d)| \qquad (22)$$

[Equation 23]

$$s_2(x,y)=|(I_a+I_d)-(I_b+I_c)| \qquad (23)$$

For example, the signal processor 48 selects either one of the signal difference $S_1(x, y)$ or $S_2(x, y)$ having a greater value, and generates an image based on the selected signal difference $S_1(x, y)$ or $S_2(x, y)$.

<3D Reconstruction>

The signal processor 48 is able to reconstruct a three-dimensional shape similar to that obtained in the first embodiment, using, for example, a combination 1 of the total signal quantity $(I_a+I_b)$ and the total signal quantity $(I_c+I_d)$ or a combination 2 of the total signal quantity $(I_a+I_d)$ and the total signal quantity $(I_b+I_c)$.

In a case of using the combination 1, the signal processor 48 substitutes $(I_a+I_b)$ for $I_A$ and $(I_c+I_d)$ for $I_B$ in equation (11) to calculate the difference $I_S$, and generates an image representing the difference $I_S$. In this way, the image representing the three-dimensional shape of the surface of the specimen 22 can be obtained.

In a case of using the combination 2, the signal processor 48 substitutes $(I_a+I_d)$ for $I_A$ and $(I_b+I_c)$ for $I_B$ in the equation (11) to calculate the difference $I_S$, and generates an image representing the difference $I_S$. In this way, the image representing the three-dimensional shape of the surface of the specimen 22 can be obtained.

Alternatively, the signal processor 48 may select a pair of the detection surfaces which are 180-degree rotational symmetric with respect to the center of the through hole 52e taken as the axis of rotation, and calculate the difference $I_S$ in the signal quantity between the detection surfaces in the selected pair.

In a case of using a combination of the signal quantity $I_a$ and the signal quantity $I_b$, the signal processor 48 substitutes the signal quantity $I_a$ for $I_A$ and the signal quantity $I_c$ for $I_B$ in equation (11), calculates the difference $I_S$, and generates the image representing the difference $I_S$. In this way, the image representing the three-dimensional shape of the surface of the specimen 22 can be obtained.

In a case of using a combination of the signal quantity $I_b$ and the signal quantity $I_d$, the signal processor 48 substitutes the signal quantity $I_b$ for $I_A$ and the signal quantity $I_d$ for $I_B$ in equation (11), calculates the difference $I_S$ using substituted equation (11), and generates the image representing the difference $I_S$. In this way, the image representing the three-dimensional shape of the surface of the specimen 22 can be obtained.

In the first embodiment, the step riser 22a may not be clearly represented, depending on the positional relationship between the extending direction of the parting line 44 of the detector 40 and the Y direction. As opposed to this, the use of the four-piece detector 52 enables, as described with reference to FIG. 39, calculation of the three-dimensional shape of the surface of the specimen 22 regardless of the positional relationship between the extending direction of the parting line of the detector 52 and the rising direction of the stepwise region.

When four signal quantities (the signal quantities $I_a$, $I_b$, $I_c$, and $I_d$) are utilized, a method other than the above-described method may be employed for generating the image representing the signal difference.

For example, a signal difference $I_{sh}$ in the horizontal direction and a signal difference $I_{sv}$ in the vertical direction may be used. In this case, equation (11) is converted into the following equations (24) and (25).

[Equation 24]
$$I_{sh} = \frac{I_a + I_b - (I_c + I_d)}{I_a + I_b + I_c + I_d} \tag{24}$$

[Equation 25]
$$I_{sv} = \frac{I_a + I_d - (I_b + I_c)}{I_a + I_b + I_c + I_d} \tag{25}$$

In addition, a height $Z_h$ in the horizontal direction and a height $Z_v$ in the vertical direction are calculated by the following equations (26) and (27).

[Equation 26]
$$Z_h(x,y) = k \int I_{sh}(x,y) dx \tag{26}$$

[Equation 27]
$$Z_p(x,y) = k \int I_{sv}(x,y) dy \tag{27}$$

The calculated heights include errors. Height correction can be performed to obtain more accurate values of the heights. As in the case of the first embodiment, the signal processor 48 extracts a flat region and performs height correction using the signal quantity of the flat region.

For example, when the detector 52 is placed with the detection surfaced being in parallel to the surface of the specimen 22, the signal quantities $I_a$, $I_b$, $I_c$, and $I_d$ obtained from the flat region have almost equal values. For this reason, when a difference between the maximum value and the minimum value in the signal quantities $I_a$, $I_b$, $I_c$, and $I_d$ is equal to or smaller than the threshold value, the signal processor 48 determines that scanned positions from which the signal quantities $I_a$, $I_b$, $I_c$, and $I_d$ are obtained are in the flat region.

When the detection surfaces of the detector 52 are not in parallel to the surface of the specimen 22, the user specifies a scanned position in a flat region, for example. The signal processor 48 calculates a difference in the signal quantity $I_a$, $I_b$, $I_c$, $I_d$ between the specified scanned position and each of the scanned positions, and determines, when all calculated differences are equal to or smaller than the threshold value, that the specified scanned position is in the flat region.

In this way, flat regions are extracted. The signal processor 48 performs the labeling processing in a manner similar to the first embodiment. Then, the signal processor 48 corrects the heights $Z_h$ and $Z_v$ in each of labeled groups, to obtain corrected heights $Z_h'$ and $Z_v'$. The signal processor 48 calculates an average of the corrected heights $Z_h'$ and $Z_v'$ as indicated in the following equation (28).

[Equation 28]
$$Z = \frac{Z_h' + Z_v'}{2} \tag{28}$$

The calculated average is the height Z of the surface of the specimen 22. In this way, the three-dimensional shape of the surface is calculated.

The above-described process is described by way of illustration, and other three-dimensional reconstruction processes may be employed. For example, the terrace region of the semiconductor wafer is flat on an atomic level. Also in the other three-dimensional reconstruction processes, after a flat region is extracted, an accurate step and terrace structure can be obtained by correcting heights of the extracted flat region so as to be equalized.

For example, a method for acquiring a stepwise shape by means of a photometric stereo (PS) method which is conventionally utilized for 3D reconstruction, extracting a flat region from the obtained stepwise shape, and correcting heights may be performed.

Figure 40:
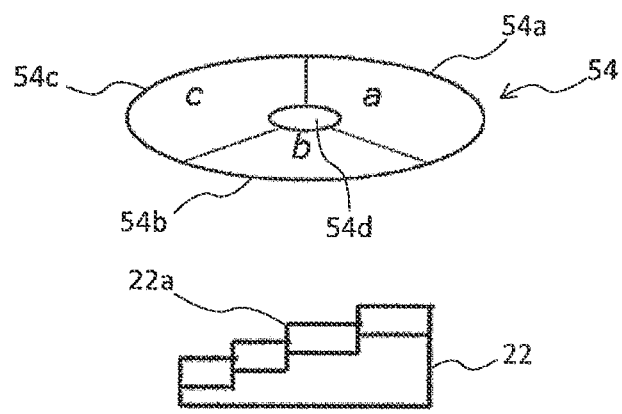
FIG. 40 is a perspective view showing the detector according to the second embodiment and a part of the specimen.

Although in the second embodiment the four-piece detector 52 has been used, a three-piece detector may be used. A three-piece detector 54 is shown in FIG. 40. FIG. 40 is a perspective view representing the detector 54 and a part of the specimen 22.

The detector 54 formed in an annular shape has a detection surface which is divided into three pieces of detection surfaces 54a, 54b, and 54c. The detection surfaces 54a, 54b, and 54c are placed at 120-degree rotational symmetric positions with respect to the center of a through hole 54d (i.e., the optical axis of the electron beam) taken as the axis of rotation.

In the example illustrated in FIG. 40, the detection surface 54a is located on an upper side of the step riser 22a on the surface of the specimen 22, and the detection surface 54c is located on a lower side of the step riser 22a. In this case, the signal processor 48 calculates a difference between signal quantities from the detection surface 54a and the detection surface 54c, and generates an image representing the difference. Then, the image in which the step risers 22a are enhanced can be obtained.

Specifically, the signal processor 48 selects two detection surfaces from the detection surfaces 54a, 54b, and 54c, calculates a difference between signal quantities from the selected two detection surfaces, and generates an image representing the difference. For example, the signal processor 48 may select two detectors in such a manner that a maximum difference in the signal quantity is obtained from the two detectors, and generates an image representing the difference. In this way, the image representing the step riser 22a in the enhanced manner can be obtained regardless of the positional relationship between the extending direction of the parting line in the detector 54 and the rising direction of the stepwise region on the surface of the specimen 22.

<Representation Form of Step Riser>

In the first and second embodiments, the signal processor 48 may represent heights of the surface of the specimen 22 with colors and change colors depending on the heights in the SEM image. Specifically, the signal processor 48 represents regions having the same height with the same single color in the SEM image, and changes colors depending on the heights. Alternatively, rather than the SEM image, the signal processor 48 may generate a two-dimensional image in which heights at scanned positions (x, y) are indicated with colors.

In another example, the signal processor 48 may represent, in the image in which the step risers are enhanced, a same terrace region with a particular color and another terrace region with another color while changing colors on a terrace region-by-terrace region basis. For example, the signal processor 48 may apply, in the image in which the step risers are enhanced, colors by means of a color scale for gradually mapping different colors from a low terrace region to a high terrace region. The signal processor 48 may extract a boundary of each of the step risers from the image in which the step risers are enhanced, and apply colors to extracted boundaries.

The boundary of the step riser in the image generated in accordance with the first embodiment may appear thicker than an actual boundary. This is caused by a phenomenon that the primary electrons are scattered and spread by the specimen 22. The signal processor 48 may find a distribution of signal quantities in a direction vertical to the step riser between different levels represented in the SEM image, and identify a scanned position at which the maximum signal quantity is obtained as an actual position of the step riser. The signal processor 48 may plot the identified actual position on the image. In this way, the image reflecting the actual position of the step riser is generated and displayed on the display 50.

The signal processor 48 may estimate a point spread function (PSF) from a scattered region of the electrons, and perform deconvolution integration processing on the image in which the step risers are enhanced, to calculate the actual position of the step riser.

In addition, the signal processor 48 may calculate, from a three-dimensional structure of a semiconductor wafer, a surface roughness which can be used as an index of quality of the semiconductor wafer. For example, the signal processor 48 may calculate a roughness parameter, such as an arithmetic mean height, and operate the display 50 to display the parameter.

Further, the signal processor 48 may evaluate the surface roughness based on an interval between step risers. For example, the signal processor 48 may calculate a dimension of a terrace in the vertical direction relative to the step riser, calculate a length of each terrace, variations in length, and an average of lengths of terraces, and operate the display 50 to display the calculated values.

Third Embodiment

Hereinafter, a third embodiment is explained. In the third embodiment, the signal processor 48 extracts a defect on the surface of a specimen based on the shape of the surface of the specimen.

As described above, the step risers which are observed in the first and second embodiments correspond to a part of a crystal lattice. When the crystal lattice extends without having any defect, the step risers extend without any breaks. However, an image representing an actual specimen may include a break in a line representing the step riser. The break derives from distortion, such as a screw dislocation, of the crystal lattice. Therefore, a location where the screw dislocation occurs can be identified by finding a site where the step riser is broken.

For example, the signal processor 48 is able to identify the site where the step riser is broken, through image processing for extracting features from an image which is generated based on differences in signal quantity. For the image processing, a corner detection method may be employed, for example.

Figure 41:
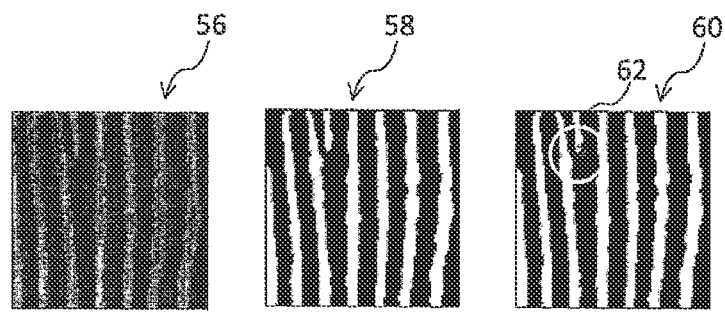
FIG. 41 is a diagram showing an SEM image.

Hereinafter, a process to extract a break in the step riser is explained with reference to FIG. 41. FIG. 41 shows images 56, 58, and 60 which are generated based on the differences in signal quantity.

The image 56 shows step risers in the enhanced manner. In the image 56, white areas represent terraces (i.e., flat regions), and black regions represent steps (i.e., step risers).

The image 58 is obtained by processing the image 56 through both noise reduction using, for example, a Gaussian filter, and binarization. As a result of processing the image 56, the step risers are clearly differentiated from other regions in the image 58. The noise reduction and the binarization may be executed, for example, by the signal processor 48.

When a typical corner detection method is applied to the image 58, corners of both white and black areas are detected. However, in this embodiment which is directed to detect a break in the steps (i.e., the step risers), the signal processor 48 extracts only corners of the step risers (i.e., corners of the black areas). The signal processor 48 performs corner extraction processing on the image 58 obtained as the binarized image, to extract the corners of the step risers. As a result, a site where the step is broken is extracted, and a position of a screw dislocation is accordingly identified. For example, in the image 60, an area in a circle indicated by reference numeral 62 is identified as the position of the screw dislocation.

<Display of Burgers Vector>

Three-dimensional structure of steps can be identified based on the three-dimensional shape of the steps in which heights are corrected in accordance with the first and second embodiments (for example, the three-dimensional shape illustrated in FIG. 36). The signal processor 48 may identify a winding direction (a clockwise direction or a counterclockwise direction) of the screw dislocation based on the three-dimensional structure of the steps. A height of the dislocation can be identified from a height of a step riser. The signal processor 48 may identify the height of the dislocation based on the height of a step riser, and calculate a Burgers vector.

For example, the signal processor 48 may extract a defect from an image in which step risers are enhanced (for example, the image 56), calculate a Burger vector of a dislocation, and represent the size and direction of the calculated Burgers vector on the image (such as, for example, the image 56). For example, the signal processor 48 represents a clockwise screw dislocation with a red color and a counterclockwise screw dislocation with a blue color.

Figure 42:
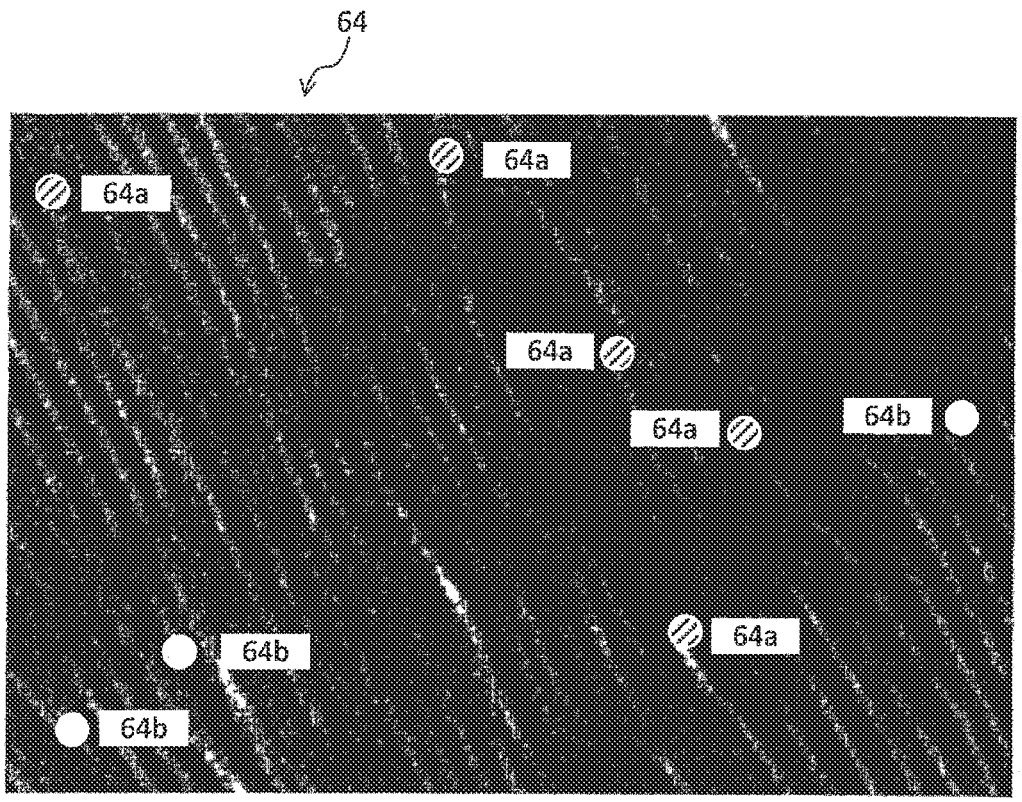
FIG. 42 is a diagram showing an SEM image.

FIG. 42 shows a colored image 64. Reference sign 64a indicates the counterclockwise screw dislocation, and areas indicated by reference sign 64a are represented with the blue color. Reference sign 64b indicates the clockwise screw dislocation, and areas indicated by reference sign 64b are represented with the red color. Alternatively, the signal processor 48 may overlay blue markers on the areas indicated by reference sign 64a in the image 64, and overlay red markers on the areas indicated by reference sign 64b in the image 64.

In consideration that any distortion of crystal is reflected on the shape of the step riser, the signal processor 48 may identify a type of a defect from the three-dimensional shape of the steps. The signal processor 48 may analyze the image representing the enhanced step risers, to evaluate a type and quantity of a distortion.

The signal processor 48 may use machine learning, deep learning, and other techniques to identify a position, a type, and a quantity of a defect. For example, defects may be visually extracted by a person from the image representing the enhanced step risers, and a computer may learn from the extracted result and create a model for extracting the defects. The signal processor 48 may use the created model for detecting, from the three-dimensional shape, positions of the defects and the number of defects per a unit area. The signal quantities $I_a$, $I_b$, $I_c$, and $I_d$ may be learned by the computer to create the model for extracting positions of the defects.

Meanwhile, when incident energy of the primary electrons is increased by changing the acceleration voltage for the electron beam, the electrons enter the specimen to a certain depth of the specimen. As a result, it becomes difficult to visually recognize the structure of the surface. On the other hand, because scattering conditions of the electrons change in a portion of the specimen where a defect of crystal is present, it becomes possible to observe a state of the defect which cannot be recognized from the surface structure. However, there is a possibility that no signal difference is obtained from the defect existing inside the specimen in an ordinary SEM image.

With this in view, in the third embodiment, after finding a position of the defect, the acceleration voltage is changed, electron beams are emitted toward a region around the found position of the defect, and signals from the reflected electrons are analyzed for a longer time. In this way, a state of the defect in a depth direction can be detected. For example, there can be observed a phenomenon that a quantity of signal from reflected electrons is increased in a particular direction, while a quantity of signal from reflected electrons is decreased in another direction. The signal processor 48 identifies, based on such a change in signals, an extending direction of the defect relative to the depth direction of the specimen and the type of the defect.

The change in signals caused by the defect in a deep region of the specimen cannot be easily detected from the ordinary SEM image. However, the position of a dislocation can be identified from the three-dimensional shape of the steps according to the third embodiment. Therefore, even though the change in signals caused by the defect is small, such a small change in signals can be detected with low noise by extending the length of time for acquiring signals from the location of the dislocation. As a result, the defect can be analyzed in detail.

Hereinafter, a method for presenting a quantity of extracted defects is explained.

For example, the signal processor 48 indicates positions of defects with points and markers on the image in which the step risers are enhanced (for example, the image 56). In addition, the signal processor 48 may change colors used for representing the defects depending on types of the defects. For example, the signal processor 48 may represent the screw dislocation with red color, an edge dislocation with blue color, and a void dislocation with green color.

Further, the signal processor 48 may calculate the number of defects per unit area, and operate the display 50 to display the calculated number of defects.

The signal processor 48 may divide the image in which the steps are enhanced into two or more areas, and calculate a defect density in each of the two or more areas. The signal processor 48 may change colors applied to the two or more areas depending on defect densities. For example, the signal processor 48 may represent areas having high defect densities with red color, and areas having low defect densities with blue color. Alternatively, the signal processor 48 may further divide the defect densities into finer levels and color the areas depending on the levels of the defect densities.

Figure 43:
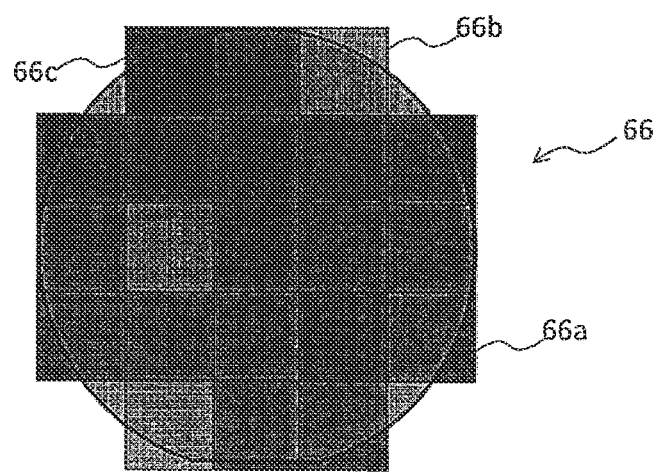
FIG. 43 is a diagram of an image representing defect densities with colors.

FIG. 43 shows an image 66 in which colors are applied to the areas depending on the defect densities. The image 66 may be the image which is generated based on the signal difference, the image which represents the step risers in the enhanced manner, or the image which is generated by mapping the scanned positions (x, y) of the electron beams.

An area indicated by reference sign 66a is represented with blue color. An area indicated by reference sign 66b is represented with yellow color. An area indicated by reference sign 66c is represented with red color. For example, blue areas, such as the area 66a, have defect densities higher than or equal to a first threshold value, and yellow areas, such as the area 66b, have defect densities lower than the first threshold value and higher than or equal to a second threshold value where the second threshold value is lower than the first threshold value. Red areas, such as the area 66c, have defect densities lower than the second threshold value.

The image 66 is, for example, displayed on the display 50. The user can recognize the defect density in each of the regions in the specimen while viewing the image 66.

For example, it becomes possible to produce elements in such a manner that an element which is resistant to influence of a defect is formed in a region having a high defect density, while an element which is susceptible to the influence of a defect is formed in a region having a low defect density. In addition, a region where a defect is apt to be created may be detected, and the result of detection may be used as a basis for analyzing a cause of the presence of the defect based on the result of detection or used as a reference for reviewing manufacturing processes of a semiconductor wafer.

Fourth Embodiment

Hereinafter, a fourth embodiment is explained. In the fourth embodiment, position information of a defect that is identified according to the third embodiment is used in an external analytical instrument.

For example, the position information of the defect is sent to a focused ion beam (FIB) apparatus. The focused ion beam apparatus processes a region including a defect indicated by the position information into a specimen applicable to a transmission electron microscope (TEM). The processed specimen is observed in the transmission electron microscope.

For example, the signal processor 48 defines a reference point which can be used as a mark on the semiconductor wafer, includes additional information, such as information about a direction of the defect with respect to the reference point and information about a distance of the defect from the reference point, into the position information of the defect, and outputs the position information of the defect including the additional information. It should be noted that the direction and the distance of the defect may be identified by any apparatuses other than the signal processor 48. The position information including the additional information may be utilized in another defect analysis method. In this case, when the other defect analysis method is performed, the position of the defect can be easily identified in operation to analyze the defect. This can shorten a length of time for analysis.

<Output of Position Information of Defect>

The position information of a defect is further described in detail below.

The reference point functioning as a guide is placed on the surface of the specimen of the semiconductor wafer. When the shape of a semiconductor wafer has a distinctive feature at a certain site, the position of a defect may be identified with respect to the site having the distinctive feature. In this case, the site having the distinctive feature may be used as the reference point. The guide used as the reference point may be a scratch formed on the surface, a mark formed of a pigment, or a grain fixed onto the surface, but is not limited to those described here. Any other marks may be used as the guide, so long as the position of the guide can shared with other apparatuses with reference to the mark.

However, in a case of using a circle mark as the guide, for example, the position of the guide can be shared with other apparatuses, although directions cannot be uniquely identified with reference to the position of the guide. In this case, the position of the defect cannot be shared among other apparatuses. On the other hand, when a mark having a directional shape, such as a letter L shape, for example, is used as the guide, directions can be uniquely defined with reference to the guide, which allows the other apparatuses to share the position of the defect. Even when the guide having the directional shape is used, however, the direction of a defect relative to the guide has a greater error as the distance between the defect and the guide increases. In this regard, two or more guides spaced from each other by an appropriate distance may be advantageously provided. In general, because the precise position of a defect is unknown at a stage of placing the guide, the guide may be placed at any position.

The specimen 22 provided with guides is set to the scanning electron microscope 10, and a region including the guides on the specimen 22 is photographed by the scanning electron microscope 10. As a result, positions of the guides are recognized in the SEM image.

Then, a three-dimensional shape having corrected heights is calculated through the process steps according to the first or second embodiment, and positions of defects are identified through the process steps according to the third embodiment. The signal processor 48 identifies the positions of the defects, calculates a direction and a distance of each of the defects relative to the guide, and outputs position information of the defects including information of directions and distances.

The position information of the defects is output to a defect analyzer, for example, and shared therein. The defect analyzer obtains, from the position information of the defects, the positions of the defects with reference to the position of the guide to analyze the defects. In this way, the information acquired by the scanning electron microscope 10 is shared with other apparatuses and used for analyzing the defects, for example.

Hereinafter, specific examples according to the fourth embodiment are described. As one example, a process of identifying the position of a defect, processing a portion of a specimen including the defect to prepare a flake of the portion with the focused ion beam apparatus, and observing the flake with the scanning electron microscope is described.

Figure 44:
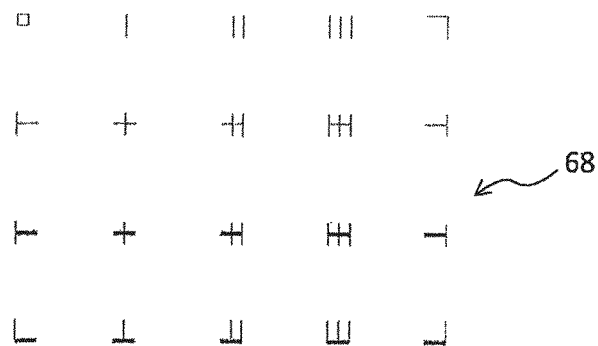
FIG. 44 is a diagram showing markers.

In this example, a guide is placed at appropriate positions on the surface of the specimen 22. Alternatively, positions of defects may be identified in the three-dimensional shape obtained through the process steps according to the third embodiment, one of the defects is selected as an object to be analyzed, and the guide may be placed in the vicinity of the selected one of the defects. FIG. 44 shows an example of the guides. A guide 68 in FIG. 44 consists of a plurality of guides having mutually different shapes. Because directions with reference to the guides can be uniquely determined, the positions of the defects can be easily obtained using the guides 68.

The specimen 22 including the guides is placed in the scanning electron microscope 10, and photographed therein. For example, the user adjusts the position of the specimen 22 and other settings so as to include the guides 68 in the SEM image while viewing the SEM image.

Figure 45:
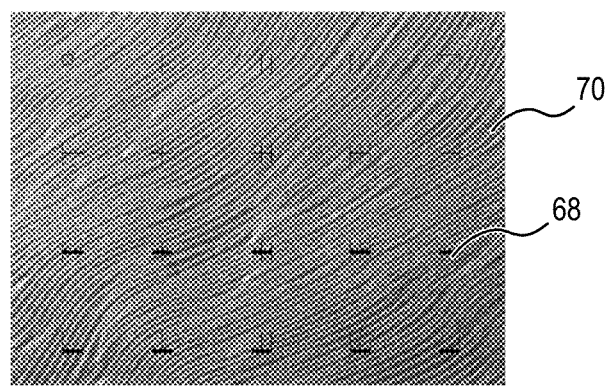
FIG. 45 is a diagram showing an SEM image.

Then, the process steps according to the first or second embodiment are performed to calculate the three-dimensional shape and the image representing the enhanced steps on the surface of the specimen 22 and calculate the shape of steps (i.e., shapes of step risers). FIG. 45 shows an image 70 representing the calculated shape of the steps. For example, the image 70 represents the steps in the enhanced manner. The image 70 further represents the guides 68.

Figure 46:
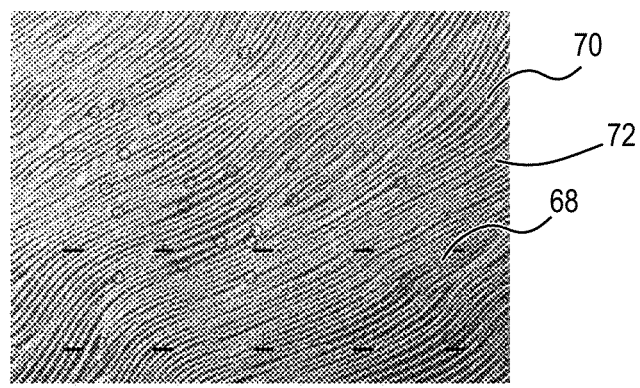
FIG. 46 is a diagram showing an SEM image.

The signal processor 48 identifies positions of defects in the obtained shape of the steps. FIG. 46 shows the identified defects. Reference sign 72 indicates the defects. When a particular defect is specified as an object to be analyzed, observation magnification may be increased to include the specified defect and a guide located close to the defect in a field of view. In addition, the direction and distance of the defect with reference to the guide may be recorded to enable acquisition of the position of the defect in a subsequent FIB process. In this way, a positional relationship between the guide and the defect is acquired.

Figure 47:
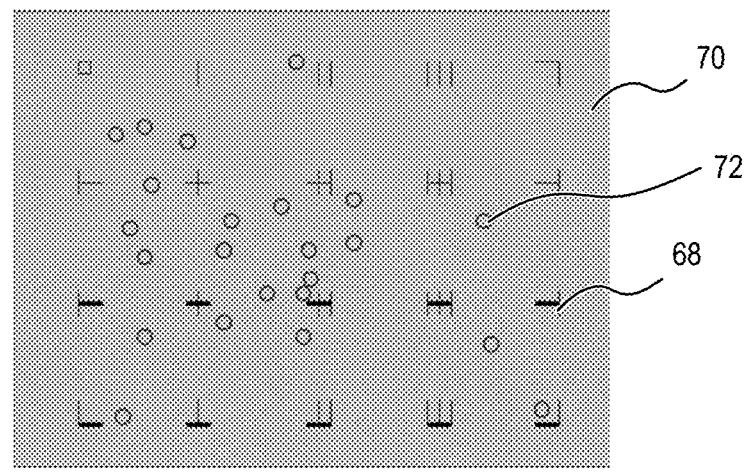
FIG. 47 is a diagram showing an SEM image.

Following this, the specimen 22 is set in the focused ion beam apparatus, and the guides 68 are observed therein. The guides 68 and the defects (indicated by reference sign 72) shown in the SEM image are overlaid on a SIM (Scanning Ion Microscope) image acquired by the focused ion beam apparatus. As a result, the positions of the defects can be recognized in the SIM image. FIG. 47 shows an example of an SIM image 74. In the SIM image 74, the guides 68 and the defects (indicated by reference sign 72) are represented.

Because an optical system of the scanning electron microscope differs from that of the focused ion beam apparatus, image distortion, such as distortion aberration, may differ between the SEM and SIM images. In this case, an amount of image distortion, such as distortion aberration, may be calculated based on relative positional shifting of the guides between the SEM and SIM images, and the distortion may be compensated based on the calculated result.

When the directions and distances of the defects with reference to the guides are recorded, the positions of the defects may be determined based on orientation and size of the guides.

Then, a portion of the specimen 22 that includes the positions of the defects obtained as described above is processed and prepared as a specimen applicable to the transmission electron microscope. In this way, the specimen for the transmission electron microscope is produced.

Any defect in a semiconductor wafer influences the performance of a device which is manufactured using the semiconductor wafer. For this reason, identifying a type of the defect in the semiconductor wafer and analyzing a source of the defect have advantageous effects on development of devices having better performance. Hereinafter, a process to analyze the defect with the transmission electron microscope is explained, the process including steps of identifying positions of defects through the process according to the third embodiment, and processing the specimen in the focused ion beam apparatus to create a flake of the specimen.

For elaborated analysis of the defect in the semiconductor wafer, it is necessary that a flake created by slicing a portion of a specimen including a defect be observed in the transmission electron microscope. The flake of the specimen can be created by means of the focused ion beam apparatus, while there are difficulties in acquiring the shape of steps and the position of the defect in an SIM image generated by the focused ion beam apparatus. On the other hand, the position of the defect can be acquired through the process according to the third embodiment.

<Defect Analysis with Cathode Luminescence (CL) Method>

An analyzing apparatus and a processing apparatus may be attached to the scanning electron microscope 10. This enables operation to conduct an analysis of a specimen while observing the SEM image, or conduct an analysis of the specimen without removing the specimen from the apparatus after observation of the SEM image. In other words, analyses and processing of the specimen can be performed in the same coordinate system as that of the scanning electron microscope 10, which can, in turn, eliminate the necessity of aligning the coordinate systems using guides. Hereinafter, a specific configuration of such a combination of apparatuses is described with reference to an example using a CL method.

The CL method is a method for detecting emission of light from a specimen irradiated with electron beams. For example, when an object to be analyzed is a defect in a semiconductor wafer, a state of dislocation (such as, for example, threading dislocation) can be analyzed. When an apparatus for implementing the CL method is combined with the scanning electron microscope 10, both operation to identify the position of a defect and operation to analyze the defect can be performed in a single apparatus.

Figure 48:
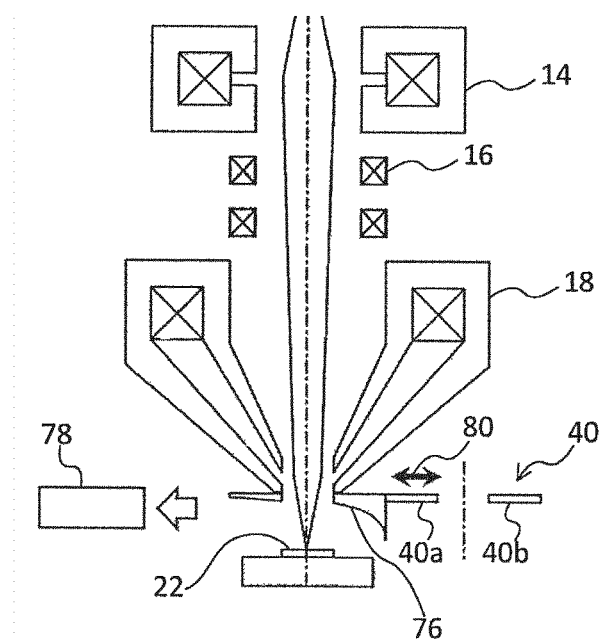
FIG. 48 is a diagram showing an apparatus in which an apparatus for implementing a CL method is combined with a scanning electron microscope.

FIG. 48 shows an apparatus 10A in which the apparatus for implementing the CL method is combined with a scanning electron microscope. In the apparatus 10A, the detector 40 according to the first embodiment is installed. In place of the detector 40, the detector 52 according to the second embodiment may be used.

The apparatus 10A further includes a condenser mirror 76 for acquiring CL and an analyzer 78 for performing an analysis according to the CL method. As indicated by an arrow 80, the condenser mirror 76 and the detector 40 are switchingly used. For example, the controller 51 controls switching between the condenser mirror 76 and the detector 40 to place either the condenser mirror 76 or the detector 40 in position above the optical axis of the electron beam.

In operation to identify the position of a defect on the surface of the specimen 22, the detector 40 is positioned above the optical axis of the electron beam, and the process according to the third embodiment is performed to acquire the shape of steps and identify the position of the defect. Following this, the condenser mirror 76 is placed above the optical axis of the electron beam, the electron beam is irradiated onto the defect, and CL light is analyzed by the analyzer 78. Typically, the CL light is analyzed while scanning the electron beam on the entire surface of the specimen 22, whereas in this method, the CL light is analyzed while selectively irradiating the electron beam onto a region in the vicinity of the defect. In this method, the defect can be analyzed within a shorter length of time.

Figure 49:
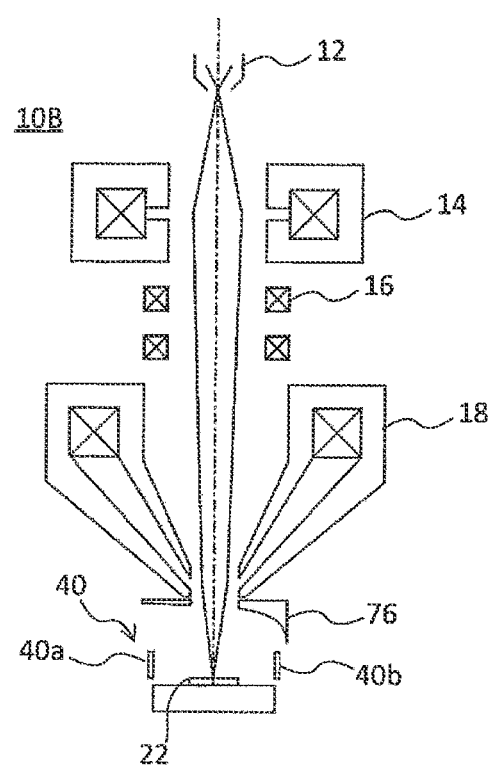
FIG. 49 is a diagram showing an apparatus in which the apparatus for implementing the CL method is combined with the scanning electron microscope.

FIG. 49 shows another apparatus 10B. In the apparatus 10B, both the detector 40 and the condenser mirror 76 are positioned above the optical axis of the electron beam. For example, the detector 40 is disposed so as to surround the specimen 22, and the condenser mirror 76 is disposed above the detector 40. The apparatus 10B further includes the analyzer 78, which is not illustrated in FIG. 49.

In the apparatus 10B, both the SEM image and the CL light can be obtained without switching the detector 40 and the condenser mirror 76. In this way, while acquiring the shape of steps, a state of dislocation can be analyzed with the CL method.

It should be noted that in the apparatus 10B, because a bias voltage applied to the specimen 22 hampers electrons from entering the detector 40, no bias voltage is applied to the specimen 22. Instead, a detector capable of detecting low-energy electrons is used as the detector 40. Alternatively, there may be employed a mechanism for applying a positive voltage to both poles of the detector 40 to direct accelerated electrons into the detector 40.

As another example, the detector 40 or the detector 52 may be installed in a focused ion beam apparatus including both an electron beam source and an ion beam source, to perform, with a single apparatus, a series of process steps from finding the position of a defect and creating a flake of a region of the specimen that includes the defect.

In addition, when the positions of the guide and the defect are identified by means of the optical system for the electron beam, a region including a defect which is specified as an object to be analyzed from extracted defects may be automatically processed into a flake.

The invention claimed is:

1. A scanning electron microscope, comprising
an electron beam irradiation apparatus configured to irradiate a specimen with an electron beam while scanning the electron beam to a plurality of positions on the specimen;
a detector having two detection surfaces which are disposed at rotationally symmetric positions with respect to an optical axis taken as an axis of rotation, the two detection surfaces configured to detect a plurality of reflected electrons released from the specimen irradiated with the electron beam, wherein the electron beam propagates along the optical axis;
a controller configured to rotate the specimen; and
a signal processor configured to generate an image based on quantities of signals from the plurality of reflected electrons which are detected by the two detection surfaces of the detector by irradiating the specimen with the electron beam after each of a plurality of rotations of the specimen,
wherein the signal processor is further configured to generate the image based on a difference between the quantities of signals detected by the two detection surfaces of the detector, wherein the signal processor is further configured to calculate a height of a surface of the specimen based on the difference between the quantities of signals, and wherein the signal processor is further configured to calculate the height of the surface of the specimen at each of the scanned positions where the electron beam is irradiated onto the surface of the specimen, extract flat regions on the surface of the specimen based on the difference between the quantities of signals at each of the scanned positions, apply labels to the flat regions to discriminate the flat regions from each other, and correct heights of the surfaces at a subset of the scanned positions existing on a same one of the flat regions to equalize the heights of the surfaces at the subset of scanned positions on the same one of the flat regions while maintaining an average of the heights of the surfaces at the subset of scanned positions on the same one of the flat regions.

2. The scanning electron microscope according to claim 1, wherein the signal processor is further configured to correct a height of a surface in a region between two of the flat regions using the corrected heights of the flat regions.

3. The scanning electron microscope according to claim 1, wherein the signal processor is further configured to extract, from the image, a crystal defect in the specimen based on a shape of a step riser formed on a surface of the specimen.

4. The scanning electron microscope according to claim 1, wherein:
 a release angle of a reflected electron relative to the specimen is defined; and
 a range of release angles of the plurality of reflected electrons detectable by the detector is defined based on an energy of the electron beam, a bias voltage applied to the specimen, and a distance between the specimen and the detector.

5. The scanning electron microscope according to claim 4, wherein the controller is configured to operate a display to display information about the range of release angles.

6. The scanning electron microscope according to claim 4, wherein two parameters are selected by a user from a group of parameters consisting of the energy of the electron beam, the bias voltage applied to the specimen, and the distance between the specimen and the detector, and a remaining parameter from the group of parameters used for detecting the plurality of reflected electrons released at an angle which is in the range of release angles is calculated based on the selected two parameters.

7. A scanning electron microscope, comprising:
 an electron beam irradiation apparatus configured to irradiate a specimen with an electron beam while scanning the electron beam to a plurality of positions on the specimen;
 a detector having three or more detection surfaces which are disposed at rotationally symmetric positions with respect to an optical axis taken as an axis of rotation, the three or more detection surfaces configured to detect a plurality of reflected electrons released from the specimen irradiated with the electron beam, wherein the electron beam propagates along the optical axis; and
 a signal processor configured to generate an image based on a quantity of a signal from the plurality of reflected electrons which are respectively detected by at least two of the three or more detection surfaces,
 wherein the signal processor is further configured to generate the image based on a difference between the quantities of signals detected by the at least two of the three or more detection surfaces of the detector,
 wherein the signal processor is further configured to calculate a height of a surface of the specimen based on the difference between the quantities of signals, and
 wherein the signal processor is further configured to calculate the height of the surface of the specimen at each of the scanned positions where the electron beam is irradiated onto the surface of the specimen, extract flat regions on the surface of the specimen based on the difference between the quantities of signals at each of the scanned positions, apply labels to the flat regions to discriminate the flat regions from each other, and correct heights of the surfaces at a subset of the scanned positions existing on a same one of the flat regions to equalize the heights of the surfaces at the subset of scanned positions on the same one of the flat regions while maintaining an average of the heights of the surfaces at the subset of scanned positions on the same one of the flat regions.

8. The scanning electron microscope according to claim 7, wherein the signal processor is further configured to correct a height of a surface in a region between two of the flat regions using the corrected heights of the flat regions.

9. The scanning electron microscope according to claim 7, wherein the signal processor is further configured to extract, from the image, a crystal defect in the specimen based on a shape of a step riser formed on a surface of the specimen.

10. The scanning electron microscope according to claim 7, wherein:
 a release angle of a reflected electron relative to the specimen is defined; and
 a range of release angles of the plurality of reflected electrons detectable by the detector is defined based on an energy of the electron beam, a bias voltage applied to the specimen, and a distance between the specimen and the detector.

11. The scanning electron microscope according to claim 10, further comprising a display to display information about the range of release angles.

12. The scanning electron microscope according to claim 10, wherein two parameters are selected by a user from a group of parameters consisting of the energy of the electron beam, the bias voltage applied to the specimen, and the distance between the specimen and the detector, and a remaining parameter from the group of parameters used for detecting the plurality of reflected electrons released at an angle which is in the range of release angles is calculated based on the selected two parameters.

13. A method for generating an image using a scanning electron microscope, the method comprising:
 irradiating a specimen with an electron beam while scanning the electron beam to a plurality of positions on the specimen;
 detecting, with a detector, a plurality of reflected electrons released from the specimen irradiated with the electron beam, the detector having two detection surfaces disposed at rotationally symmetric positions with respect to an optical axis of the electron beam taken as an axis of rotation,
 generating an image based on a quantity of a signal from the plurality of reflected electrons detected by the two detection surfaces of the detector,
 generating the image based on a difference between the quantities of signals detected by the two detection surfaces of the detector, calculating a height of a surface of the specimen based on the difference between the quantities of signals, and calculating the height of the surface of the specimen at each of the scanned positions where the electron beam is irradiated onto the surface of the specimen, extracting flat regions on the surface of the specimen based on the difference between the quantities of signals at each of the scanned positions, applying labels to the flat regions to discriminate the flat regions from each other, and correcting heights of the surfaces at a subset of the scanned positions existing on a same one of the flat regions to equalize the heights of the surfaces at the subset of scanned positions on the same one of the flat regions while maintaining an average of the heights of the surfaces at the subset of scanned positions on the same one of the flat regions.

\* \* \* \* \*